United States Patent
Lin et al.

(10) Patent No.: US 10,002,570 B2
(45) Date of Patent: Jun. 19, 2018

(54) ELECTRONIC DISPLAY DRIVING SCHEME SYSTEMS AND METHODS

(71) Applicant: Apple Inc., Cupertino, CA (US)

(72) Inventors: Chin-Wei Lin, Cupertino, CA (US); Vasudha Gupta, San Jose, CA (US); Yafei Bi, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 188 days.

(21) Appl. No.: 14/975,389

(22) Filed: Dec. 18, 2015

(65) Prior Publication Data

US 2017/0053599 A1  Feb. 23, 2017

Related U.S. Application Data

(60) Provisional application No. 62/208,392, filed on Aug. 21, 2015.

(51) Int. Cl.
| | |
|---|---|
| G09G 3/3283 | (2016.01) |
| G09G 3/3258 | (2016.01) |
| G09G 3/3266 | (2016.01) |
| G09G 3/36 | (2006.01) |
| G09G 3/3225 | (2016.01) |

(Continued)

(52) U.S. Cl.
CPC ......... G09G 3/3283 (2013.01); G09G 3/2048 (2013.01); G09G 3/3225 (2013.01); G09G 3/3258 (2013.01); G09G 3/3266 (2013.01); G09G 3/3275 (2013.01); G09G 3/3614 (2013.01); G09G 3/3688 (2013.01); G09G 2300/0819 (2013.01); G09G 2310/0254 (2013.01); G09G 2310/0291 (2013.01); G09G 2320/0204 (2013.01); G09G 2320/0233 (2013.01); G09G 2320/0247 (2013.01); H03F 2200/375 (2013.01)

(58) Field of Classification Search
CPC ... G09G 3/3614; G09G 3/3685; G09G 3/3688
See application file for complete search history.

(56) References Cited

U.S. PATENT DOCUMENTS

| | | | |
|---|---|---|---|
| 8,698,701 | B2 | 4/2014 | Margulis |
| 8,717,300 | B2 | 5/2014 | Kishi |
| 9,013,384 | B2 | 4/2015 | Al-Dahle et al. |

(Continued)

OTHER PUBLICATIONS

International Search Report and Written Opinion for PCT Application No. PCT/US2016/047809 dated Nov. 9, 2016; 15 pgs.

*Primary Examiner* — Sepehr Azari
(74) *Attorney, Agent, or Firm* — Fletcher Yoder PC

(57) ABSTRACT

Systems and method for improving display quality of an electronic display. In one embodiment the electronic display includes a first display pixel that facilitates displaying a first image frame using first amplified image data and facilitates displaying a second image frame using second amplified image data; a second display pixel that facilitates displaying the first image frame using third amplified image data; a first amplifier that operates in a first operational mode to generate the first amplified image data based on image data corresponding with the first image frame and operates in a second operational mode to generate the second amplified image data based on image data corresponding with the second image frame; and a second amplifier that operates in the second operational mode to generate the third amplified image data based on the image data corresponding with the first image frame.

25 Claims, 11 Drawing Sheets

(51) Int. Cl.
   *G09G 3/3275*   (2016.01)
   *G09G 3/20*   (2006.01)

(56) References Cited

U.S. PATENT DOCUMENTS

| | | |
|---|---|---|
| 2012/0013598 A1 | 1/2012 | Choe |
| 2013/0069717 A1 | 3/2013 | Kim et al. |
| 2013/0113775 A1 | 5/2013 | Seo |
| 2015/0109355 A1 | 4/2015 | Wang et al. |

ELECTRONIC DISPLAY DRIVING SCHEME SYSTEMS AND METHODS

CROSS REFERENCE TO RELATED APPLICATIONS

This application is a Non-Provisional application claiming priority to U.S. Provisional patent application Ser. No. 62/208,392, entitled "ELECTRONIC DISPLAY DRIVING SCHEME SYSTEMS AND METHODS," filed Aug. 21, 2015, which is herein incorporated by reference.

BACKGROUND

The present disclosure relates generally to electronic displays and, more particularly, to driving schemes used to display image frames on the electronic displays.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices include an electronic display that displays visual representations based on received image data. More specifically, the image data may include a voltage that indicates desired luminance (e.g., brightness) of a display pixel. For example, in an organic light emitting diode (OLED) display, the image data may be input to and amplified by one or more amplifiers. The amplified image data may then be supplied the gate of a switching device (e.g., a thin film transistor) in a display pixel. Based on magnitude of the supplied voltage, the switching device may control magnitude of supply current flowing into a light emitting component (e.g., OLED) of the display pixel.

The display pixel may then emit light based on magnitude of the supply current flowing through the light emitting component. For example, as magnitude of the supply current increases, the luminance (e.g., brightness and/or grayscale value) of the display pixel may increase. On the other hand, as magnitude of the supply current decreases, the luminance of the display pixel may decrease. In other words, any change in magnitude of the supply current may cause a change in luminance of a display pixel.

As such, noise introduced in the image data, the supply current, and/or the amplified image data may cause luminance variations in a display pixel. For example, an amplifier may introduce noise in generated amplified image data due to intrinsic characteristics of the amplifier. Thus, when the amplified image data is supplied to the switching device, the noise in the amplified image data may cause a corresponding noise in the supply current. The noise in the supply current may then cause the luminance of the display pixel to vary from surrounding display pixels and/or from its luminance in a directly previous or directly subsequent image frame, which may be perceivable as a visual artifact or mura.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to electronic displays that display image frames to facilitate visually presenting information. Generally an electronic display displays an image frame by controlling luminance of its display pixels based at least in part on image data indicating desired luminance of the display pixels. For example, to facilitate displaying an image frame, an organic light emitting diode (OLED) may display may receive image data, amplify the image data using one or more amplifiers, and supply amplified image data to display pixels. When activated, display pixels may apply the amplified image data to the gate of a switching device (e.g., thin-film transistor) to control magnitude of the supply current flowing through a light emitting component (e.g., OLED). In this manner, since the luminance of OLED display pixels is based on supply current flowing through their light emitting components, the image frame may be displayed based at least in part on corresponding image data.

However, luminance of OLED display pixels may also be affected by other factors. For example, noise introduced in the amplified image data by the one or more amplifiers may cause luminance variations in the OLED display pixels. When drastic enough, the luminance variations may be perceivable as visual artifacts or muras.

Accordingly, the techniques described herein facilitate improving displayed image quality of an OLED display by reducing likelihood of displaying perceivable visual artifacts. In some embodiments, the OLED display may utilize drive schemes that facilitate spatial luminance average and/or temporal luminance averaging to reduce perceivability of luminance variations. As used herein, a "driving scheme" is intended to describe the operational mode of each amplifier used to generate amplified image data supplied to the display pixels.

In some embodiments, the operational modes of the amplifiers may include a non-inverting operational mode and an inverting operational mode. When operating in the non-inverting operational mode, an amplifier may input image data to its non-inverting terminal and a feedback of amplified image data to its inverting terminal. When operating in the inverting mode, the amplifier may input image data to its inverting terminal and input a feedback of amplified image data to its non-inverting terminal. Operating in the non-inverting operational mode and the inverting operational mode may introduce different noise profiles (e.g., range of voltages) in the amplified image data. In fact, in some embodiments, noise profiles introduced may be the inverse of one another.

Accordingly, in some embodiments, the driving schemes may be defined such that an amplifier alternates between operating in a first (e.g., non-inverting) operational mode and a second (e.g., inverting) operational mode when displaying successive image frames. In such embodiments, an OLED display pixel may facilitate displaying a first image frame using amplified image data generated using the first operational mode successively displaying a second image frame using amplified image data generated using the second operational mode. As such, temporal luminance averaging between the successively displayed image frames may facilitate reducing perceptibility of luminance variations caused by amplified introduced noise. However, the effectiveness of temporal luminance averaging may be dependent on refresh rate of the electronic display.

Accordingly, in some embodiments, the driving schemes may be defined such that, to display an image frame, a first amplifier operates in a first (e.g., non-inverting) operational mode and a second amplifier, adjacent the first amplifier, operates in a second (e.g., inverting) operational mode. In such embodiments, a first OLED display pixel may facilitate displaying the first image frame using amplified image data generated using the first operational mode and a second display pixel, directly adjacent the first display pixel, may facilitate displaying the first image frame using amplified image data generated using the second operational mode. As such, spatial luminance averaging between the directly adjacent display pixels may facilitate reducing perceptibility of luminance variations caused by amplified introduced noise. In fact, in some embodiment, the driving schemes may be define such that both spatial luminance averaging and temporal luminance averaging are utilized, thereby further reducing perceivability of luminance variations and, thus, improving displayed image quality.

BRIEF DESCRIPTION OF THE DRAWINGS

Various aspects of this disclosure may be better understood upon reading the following detailed description and upon reference to the drawings in which.

DETAILED DESCRIPTION

Figure 1:
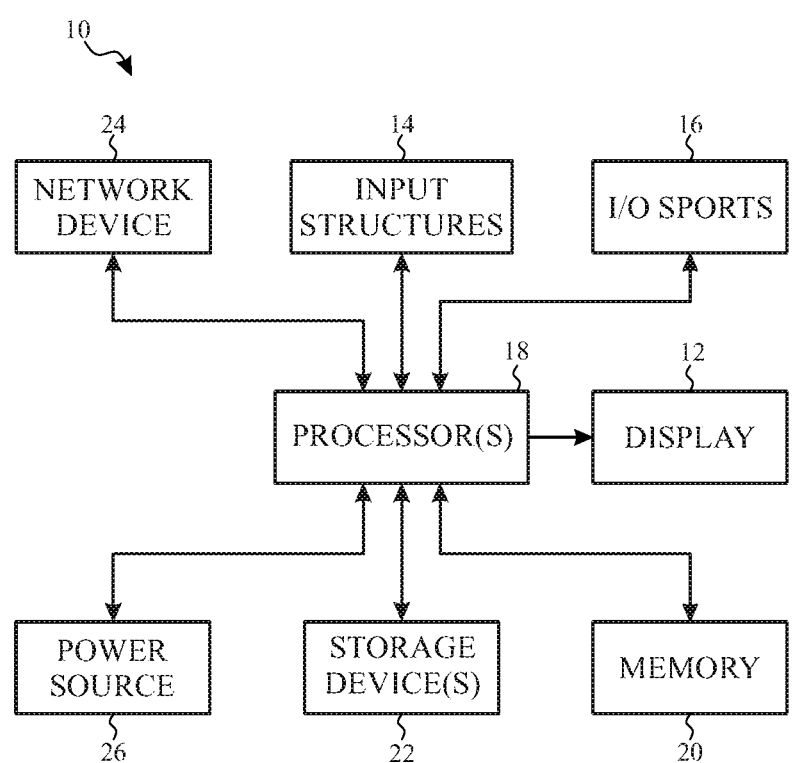
FIG. 1 is a block diagram of a electronic device with an electronic display, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, embodiments of the present disclosure relate to electronic displays used to display visual representations as image frames. Thus, electronic displays are often included in various electronic devices to facilitate visually presenting information to users. In fact, different electronic devices may utilize different types of electronics displays. For example, some electronic devices may utilize a liquid crystal (LCD) display while other electronic devices utilize organic light emitting diode (OLED) display, such as active matrix organic light emitting diode (AMOLED) displays and passive matrix organic light emitting diode (PMOLED) displays, and still other electronic devices may utilize micro light emitting diode (μLED) displays.

However, operation between different types of electronic displays may vary. For example, an LCD display may display an image frame by controlling luminance (e.g., brightness and/or grayscale value) of LCD display pixels based on orientation of liquid crystals. More specifically, in an LCD display pixel, a voltage based on received image data may be applied to a pixel electrode, thereby generating an electric field that orients the liquid crystals. In some embodiments, to reduce likelihood of polarizing the LCD display pixel, polarity of the voltage applied to the pixel electrode may be positive for some image frames and negative for other image frames.

On the other hand, an OLED display may display an image frame by controlling luminance (e.g., brightness and/or grayscale value) of OLED display pixels based on magnitude of supply current flowing through a light emitting component (e.g., OLED) of the display pixels. More specifically, a voltage based on received image data may be applied to the gate of a switching device (e.g., thin-film transistor) in an OLED display pixel to control magnitude of supply current flowing to its light emitting component. In some embodiments, since luminance of the OLED display pixel is controlled by magnitude of supply current, polarity of the voltage applied to the switching device may remain the same for each image frame.

Although differences exist, some operational principles of different types of electronic displays may be similar. For example, as described above, the LCD display and the OLED display may both display image frames by controlling luminance of their display pixels. Additionally, the LCD display and the OLED display may both control luminance of their display pixels based on received image data, which may indicate desired luminance of display pixels based on magnitude of its voltage. Furthermore, in some embodiments, the LCD display and the OLED display may both amplify the image data and use the amplified image data to control operation in their display pixels. In other words, although the present disclosure is described in regard to OLED displays, one of ordinary skill in the art should be able to adapt the techniques described herein to other types of suitable electronic displays.

As described above, an OLED display may display image frames by controlling luminance of its display pixels. In some embodiments, an OLED display pixel may include a self-emissive light emitting component that emits light based at least in part on magnitude of current supplied to a storage capacitor. For example, as magnitude of the supply current increases, the luminance of the display pixel may also increase. On the other hand, as magnitude of the supply current decreases, the luminance of the display pixel may also decrease.

Additionally, the OLED display may control magnitude of the supply current to the display pixel using a switching device (e.g., a thin-film transistor). In some embodiments, the OLED display may receive image data indicating desired luminance of the display pixel, amplify the image data, and apply the amplified image data to a gate of the switching device. In such embodiments, voltage of the amplified image data may control width of the switching device channel available to conduct supply current to the light emitting component. For example, as magnitude of the amplified image data increases, the magnitude of the supply current may increase. On the other hand, as magnitude of the amplified image data decreases, the magnitude of the supply current may decrease. In this manner, the OLED display may adjust luminance of the display pixels based at least in part on received image data.

However, the luminance of OLED display pixels may also be affected by other factors, such as noise introduced in the image data, the amplified image data, and/or the supply current. When drastic enough, the luminance variations caused by introduced noise may be perceivable as visual artifacts or muras. In some embodiments, noise may be introduced in the amplified image data by intrinsic characteristics (e.g., imperfections) of an amplifier that generates the amplified image data. For example, when the desired amplified image data is 3 V, the generated amplified image data may actually be 3 V with a noise between 5 mV and −5 mV.

Since the amplified image data is applied to the switching device, noise in the amplified image data may introduce noise in the supply current. In other words, the supply current may also vary from a desired magnitude based at least in part on the noise the in the amplified image data. The noise in the supply current may then cause variations in luminance of the OLED display pixels.

In some embodiments, the luminance variations may depend at least in part on desired grayscale value of a display pixel. For example, the same amount of noise in supply current may cause a larger luminance variation when the desired grayscale value is lower and a smaller luminance variation when the desired grayscale value is higher. Additionally, perceivability of luminance variations may depend at least in part on refresh rate of the OLED electronic display. For example, the same amount of luminance variation may be more likely to be perceived when operating at a lower refresh rate and less likely to be perceived when operating at a higher refresh rate.

Accordingly, as will be described in more detail below, the techniques described herein facilitate improving displayed image quality of an OLED display by reducing likelihood of displaying perceivable visual artifacts. In some embodiments, the OLED display may alternate between multiple driving schemes used to display successive image frames. For example, the OLED display may display a first image frame using a first driving scheme, a second image frame using a second driving scheme, a third image frame using the first driving scheme, a fourth image frame using the second driving scheme, and so on.

As used herein, a "driving scheme" is intended to describe the operational mode of each amplifier used to generate amplified image data supplied to the display pixels. For example, an amplifier may operate in a first (e.g., non-inverting) operational mode when image data is input to it non-inverting terminal and a feedback of the amplified image data is input to its inverting terminal. On the other hand, the amplifier may operate in a second (e.g., inverting) operational mode when image data is input to its inverting terminal and a feedback of the amplified image data is input to its non-inverting terminal.

As described above, the amplifier may introduce noise in the amplified image data. In some embodiments, the noise may be based at least in part on the operational mode of the amplifier. For example, when operating in the first operational mode, the amplifier may randomly introduce between −1 mV and 5 mV of noise in the amplified image data. On the other hand, when operating in the second operational mode, the amplifier may randomly introduce between −5 mV and 1 mV of noise in the amplified image data. In such embodiments, operating in the first operational mode and the second operational mode may produce noise in voltage ranges with opposite polarity, which may facilitate reducing perceivability of luminance variations due to luminance averaging.

Accordingly, in some embodiments, the driving schemes may be defined such that, to display successive image frames, an amplifier alternates between operating in the first operational mode and the second operational mode. For example, when a first image frame is displayed using a first driving scheme and a second image is display using a second driving scheme, the first driving scheme may be defined such that the amplifier operates in the first operational mode to supply amplified image data to a display pixel and the second driving scheme may be defined such that the amplifier operates in the second operational mode to supply amplified image to the display pixel. In this manner, luminance of the display pixel in the first image frame and the second image frame may temporally average, thereby reducing perceptibility of luminance variations caused by introduced noise. As such, displaying successive image frames using driving schemes that alternate between operating amplifiers in the first operational mode and the second operational mode may reduce likelihood of displaying a perceptible visual artifact.

Additionally, in some embodiments, the driving schemes may be defined such that, to display an image frame, a first amplifier operates in the first operational mode and a second amplifier, adjacent the first amplifier, operates in the second operational mode. For example, a driving scheme used to display an image frame may be defined such that the first amplifier operates in the first operational mode to supply amplified image data to a first display pixel and the second amplifier operates in a second operational mode to supply amplified image data to a second display pixel, which is directly adjacent (e.g., directly above, directly below, directly to the right of, or directly to the left of) the first display pixel. In this manner, luminance of the first display pixel and the second display pixel may spatially average, thereby reducing perceptibility of luminance variations caused by introduced noise. As such, displaying an image frame using a driving scheme that operates adjacent amplifiers in different operational modes may reduce likelihood of displaying a perceptible visual artifact.

To help illustrate, a computing device 10 that may utilize an electronic display 12 to display image frames is described in FIG. 1. As will be described in more detail below, the computing device 10 may be any suitable computing device, such as a handheld computing device, a tablet computing device, a notebook computer, and the like.

Accordingly, as depicted, the computing device 10 includes the electronic display 12, input structures 14, input/output (I/O) ports 16, one or more processor(s) 18, memory 20, a non-volatile storage device 22, a network interface 24, and a power source 26. The various components described in FIG. 1 may include hardware elements (e.g., circuitry), software elements (e.g., a tangible, non-transitory computer-readable medium storing industrious), or a combination of both hardware and software elements. It should be noted that FIG. 1 is merely one example of a particular implementation and is intended to illustrate the types of components that may be present in the computing device 10. Additionally, it should be noted that the various depicted components may be combined into fewer components or separated into additional components. For example, the memory 20 and the non-volatile storage device 22 may be included in a single component.

As depicted, the processor 18 is operably coupled with memory 20 and/or the non-volatile storage device 22. More specifically, the processor 18 may execute instruction stored in memory 20 and/or non-volatile storage device 22 to perform operations in the computing device 10, such as generating and/or transmitting image data to the electronic display 12. As such, the processor 18 may include one or more general purpose microprocessors, one or more application specific processors (ASICs), one or more field programmable logic arrays (FPGAs), or any combination thereof.

Additionally, the memory 20 and the non-volatile storage device 22 may be tangible, non-transitory, computer-readable mediums that store instructions executable by and data to be processed by the processor 18. For example, the memory 20 may include random access memory (RAM) and the non-volatile storage device 22 may include read only memory (ROM), rewritable flash memory, hard drives, optical discs, and the like. By way of example, a computer program product containing the instructions may include an operating system or an application program.

Additionally, as depicted, the processor 18 is operably coupled with the network interface 24 to communicatively couple the computing device 10 to a network. For example, the network interface 24 may connect the computing device 10 to a personal area network (PAN), such as a Bluetooth network, a local area network (LAN), such as an 802.11x Wi-Fi network, and/or a wide area network (WAN), such as a 4G or LTE cellular network. Furthermore, as depicted, the processor 18 is operably coupled to the power source 26, which may provide power to the various components in the computing device 10, such as the electronic display 12. As such, the power source 26 may include any suitable source of energy, such as a rechargeable lithium polymer (Li-poly) battery and/or an alternating current (AC) power converter.

As depicted, the processor 18 is also operably coupled with I/O ports 16, which may enable the computing device 10 to interface with various other electronic devices, and input structures 14, which may enable a user to interact with the computing device 10. Accordingly, the inputs structures 14 may include buttons, keyboards, mice, trackpads, and the like. Additionally, the electronic display 12 may include touch components that facilitate user inputs by detecting occurrence and/or position of an object touching its screen (e.g., surface of the electronic display 12).

In addition to enabling user inputs, the electronic display 12 present visual representations by displaying display image frames, such as a graphical user interface (GUI) for an operating system, an application interface, a still image, or video content. As depicted, the electronic display 12 is operably coupled to the processor 18. Accordingly, image frames displayed by the electronic display 12 may be based on image data received from the processor 18. As will be described in more detail below, in some embodiments, the electronic display 12 may display image frames by controlling supply current flowing into one or more display pixels.

Figure 2:
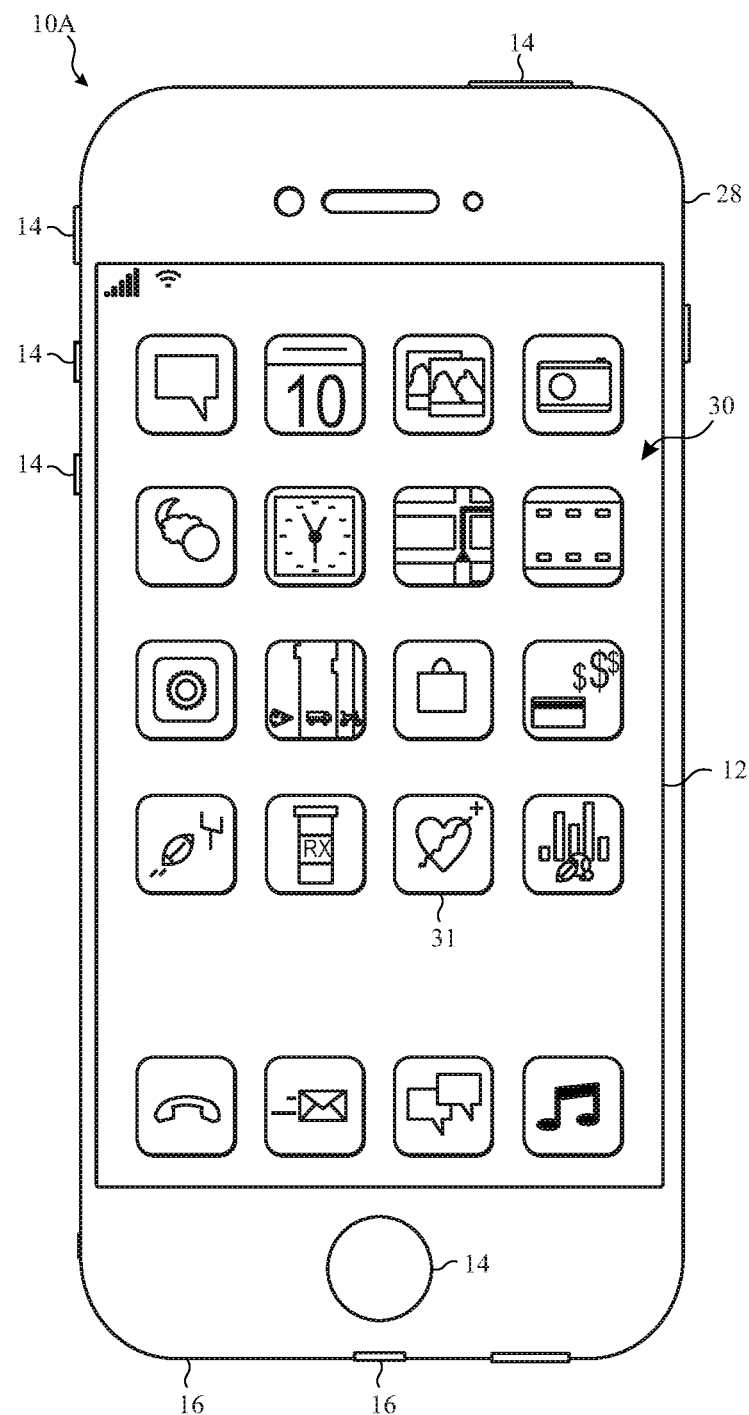
FIG. 2 is an example of the electronic device of FIG. 1, in accordance with an embodiment.

As described above, the computing device 10 may be any suitable electronic device. To help illustrate, one example of a handheld device 10A is described in FIG. 2, which may be a portable phone, a media player, a personal data organizer, a handheld game platform, or any combination of such devices. For example, the handheld device 10A may be a smart phone, such as any iPhone® model available from Apple Inc. As depicted, the handheld device 10A includes an enclosure 28, which may protect interior components from physical damage and to shield them from electromagnetic interference. The enclosure 28 may surround the electronic display 12, which, in the depicted embodiment, displays a graphical user interface (GUI) 30 having an array of icons 31. By way of example, when an icon 31 is selected either by an input structure 14 or a touch component of the electronic display 12, an application program may launch.

Additionally, as depicted, input structure 14 may open through the enclosure 28. As described above, the input structures 14 may enable a user to interact with the handheld device 10A. For example, the input structures 14 may activate or deactivate the handheld device 10A, navigate a user interface to a home screen, navigate a user interface to a user-configurable application screen, activate a voice-recognition feature, provide volume control, and toggle between vibrate and ring modes. Furthermore, as depicted, the I/O ports 16 open through the enclosure 28. In some embodiments, the I/O ports 16 may include, for example, an audio jack to connect to external devices.

Figure 3:
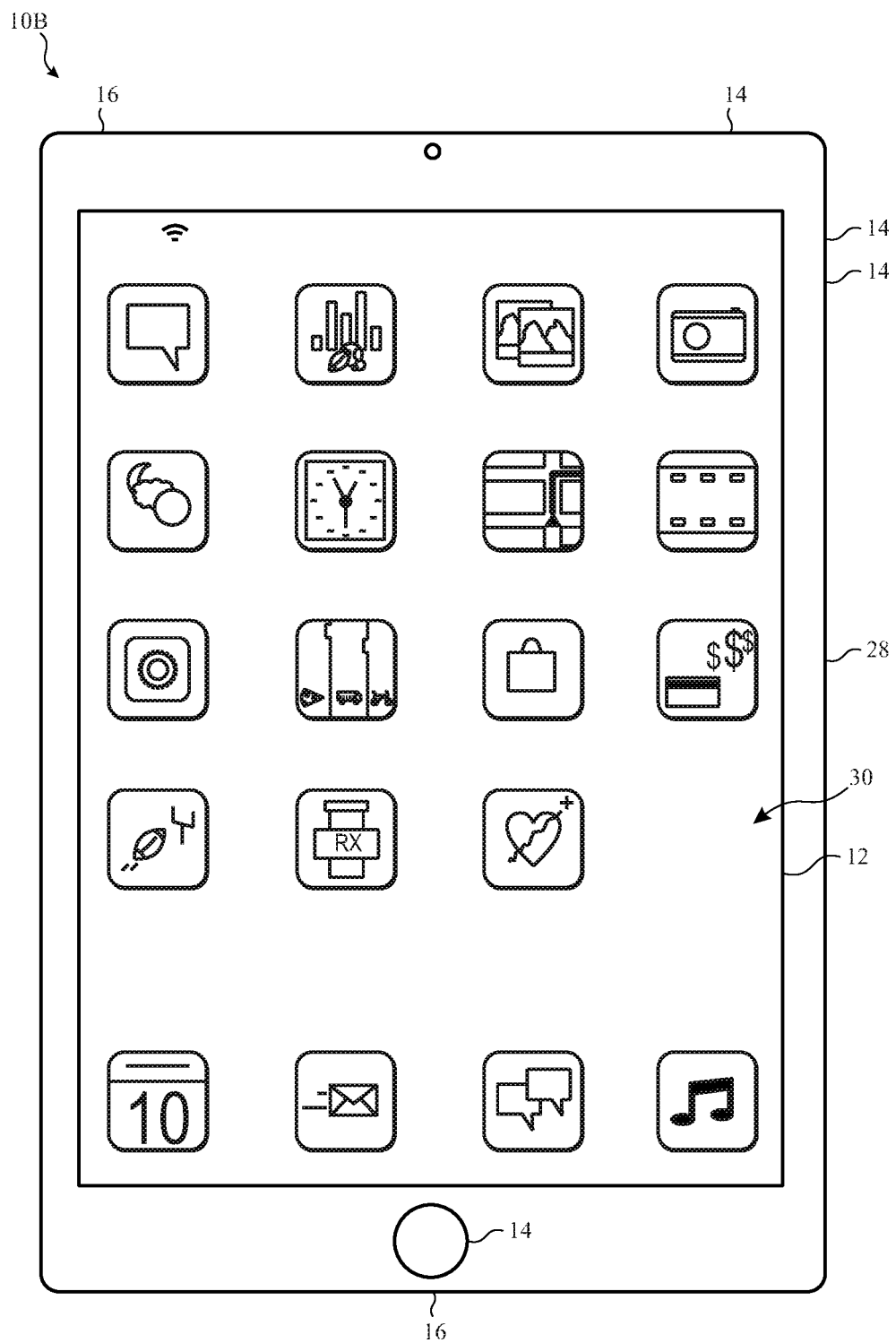
FIG. 3 is an example of the electronic device of FIG. 1, in accordance with an embodiment.
Figure 4:
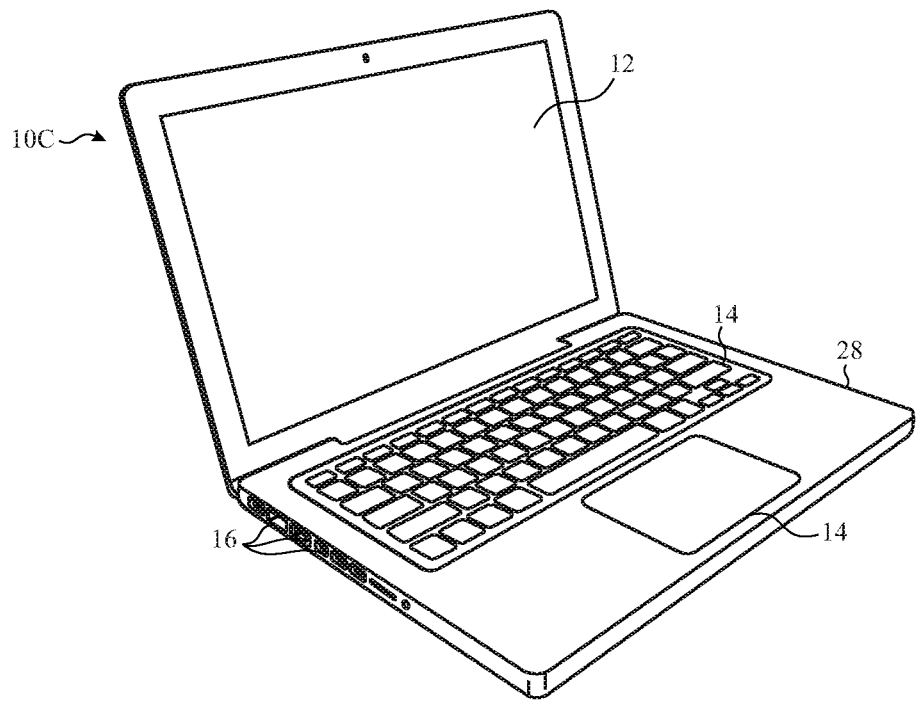
FIG. 4 is an example of the electronic device of FIG. 1, in accordance with an embodiment.
Figure 5:
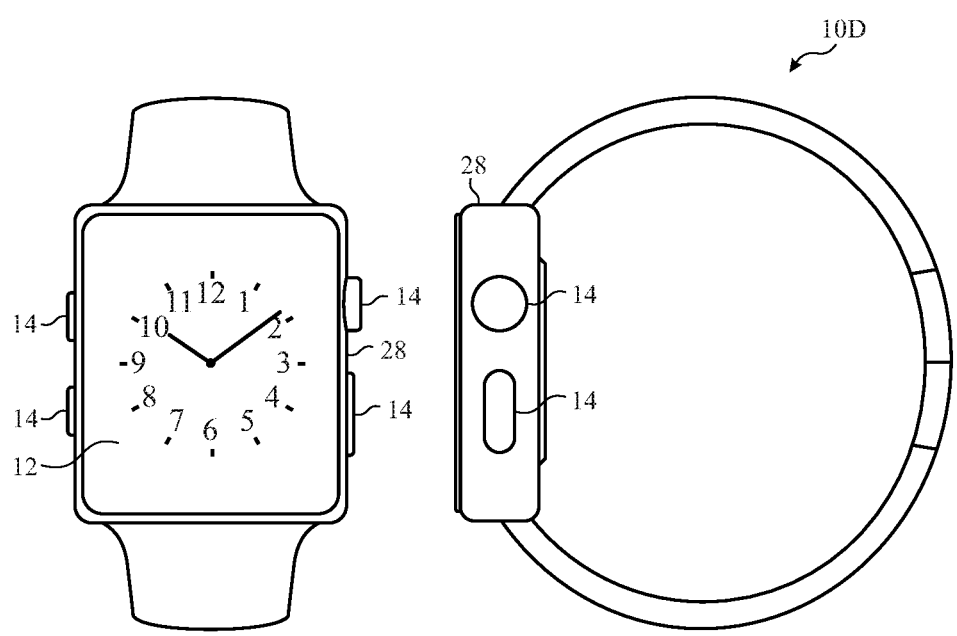
FIG. 5 is an example of the electronic device of FIG. 1, in accordance with an embodiment.

To further illustrate a suitable computing device 10, a tablet device 10B is described in FIG. 3, such as any iPad® model available from Apple Inc. Additionally, in other embodiments, the computing device 10 may take the form of a computer 10C as described in FIG. 4, such as any Macbook® or iMac® model available from Apple Inc. Furthermore, in other embodiments, the computing device 10 may take the form of a watch 10D as described in FIG. 5, such as an Apple Watch® model available from Apple Inc. As depicted, the tablet device 10B, the computer 10C, and the watch 10D may each also include an electronic display 12, input structures 14, I/O ports 16, an enclosure 28, or any combination thereof.

As described above, the computing device 10 may include an electronic display 12 to facilitate presenting visual representations to one or more users. Accordingly, the electronic display 12 may be any one of various suitable types. For example, in some embodiments, the electronic display 12 may be an LCD display while, in other embodiments, the display may be an OLED display, such as an AMOLED display or a PMOLED display. Although operation may vary, some operational principles of different types of electronic displays 12 may be similar. For example, electronic displays 12 may generally display image frames by controlling luminance of their display pixels based on received image data.

Figure 6:
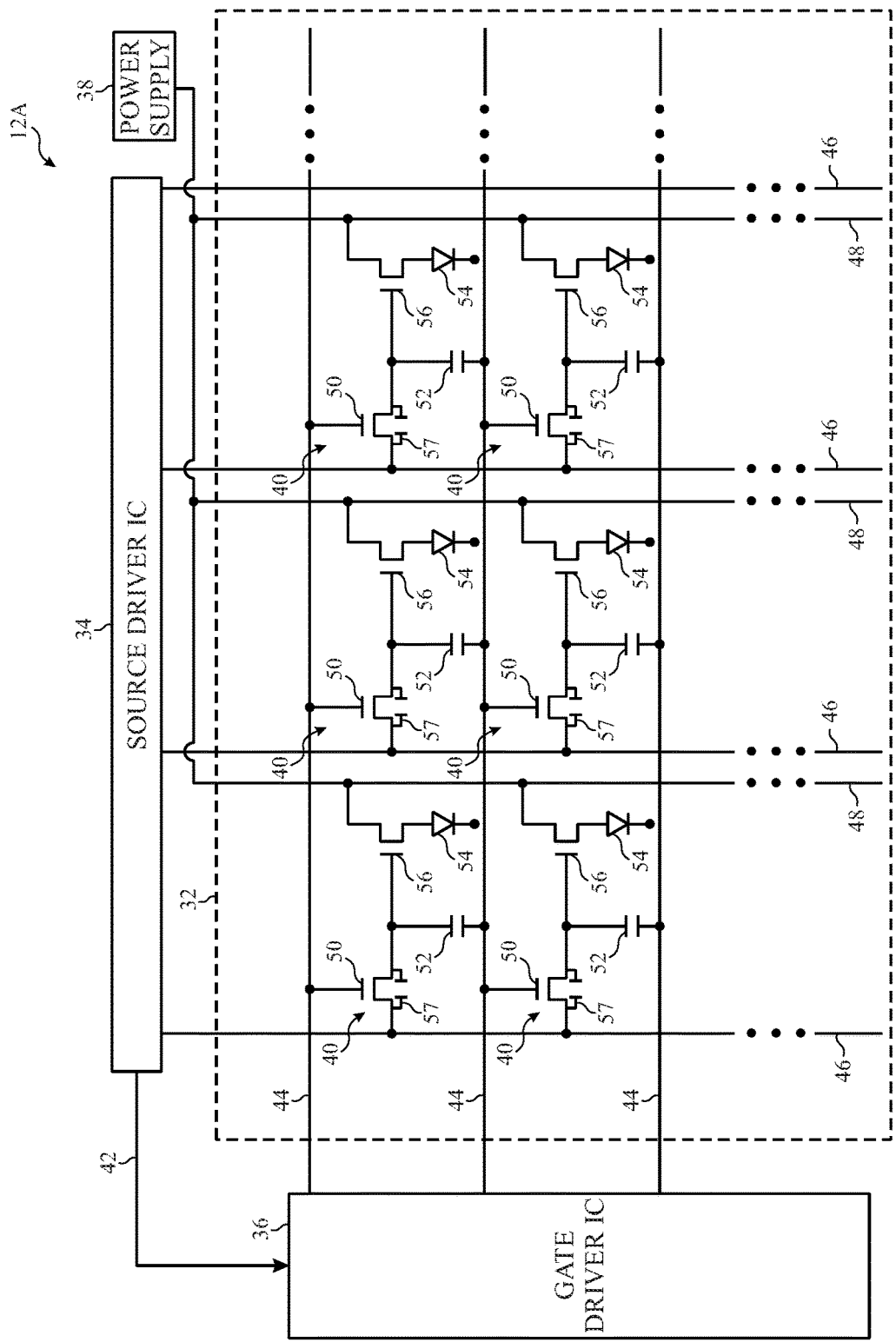
FIG. 6 is block diagram of an organic light emitting diode (OLED) electronic display, in accordance with an embodiment.

To help illustrate, one embodiment of an OLED display 12A is described in FIG. 6. As depicted, the OLED display 12 A includes a display panel 32, a source driver 34, a gate driver 36, and a power supply 38. Additionally, the display panel 32 may include multiple display pixels 40 arranged as an array or matrix defining multiple rows and columns. For example, the depicted embodiment includes a six display pixels 40. It should be appreciated that although only six display pixels 40 are depicted, in an actual implementation the display panel 32 may include hundreds or even thousands of display pixels 40.

As described above, an electronic display 12 may display image frames by controlling luminance of its display pixels 40 based at least in part on received image data. To facilitate displaying an image frame, a timing controller may determine and transmit timing data 42 to the gate driver based at least in part on the image data. For example, in the depicted embodiment, the timing controller may be included in the source driver 34. Accordingly, in such embodiments, the source driver 34 may receive image data that indicates desired luminance of one or more display pixels 40 for displaying the image frame, analyze the image data to determine the timing data 42 based at least in part on what display pixels 40 the image data corresponds to, and transmit the timing data 42 to the gate driver 36. Based at least in part on the timing data 42, the gate driver 36 may then transmit gate activation signals to activate a row of display pixels 40 via a gate line 44.

When activated, luminance of a display pixel 40 may be adjusted by amplified image data received via data lines 46. In some embodiments, the source driver 34 may generate the amplified image data by receiving the image data and amplifying voltage of the image data. The source driver 34 may then supply the amplified image data to the activated pixels. Thus, as depicted, each display pixel 40 may be located at an intersection of a gate line 44 (e.g., scan line) and a data line 46 (e.g., source line). Based on received amplified image data, the display pixel 40 may adjust its luminance using electrical power supplied from the power supply 38 via power supply lines 48.

As depicted, each display pixel includes a circuit switching thin-film transistor (TFT) 50, a storage capacitor 52, an OLED 54, and a driving TFT 56. To facilitate adjusting luminance, the driving TFT 56 and the circuit switching TFT 50 may each serve as a switching device that is controllably turned on and off by voltage applied to its gate. In the depicted embodiment, the gate of the circuit switching TFT 50 is electrically coupled to a gate line 44. Accordingly, when an gate activation signal received from its gate line 44 is above its threshold voltage, the circuit switching TFT 50 may turn on, thereby activating the display pixel 40 and charging the storage capacitor 52 with amplified image data received at its data line 46.

Additionally, in the depicted embodiment, the gate of the driving TFT 56 is electrically coupled to the storage capacitor 52. As such, voltage of the storage capacitor 52 may control operation of the driving TFT 56. More specifically, in some embodiments, the driving TFT 56 may be operated in an active region to control magnitude of supply current flowing from the power supply line 48 through the OLED 54. In other words, as gate voltage (e.g., storage capacitor 52 voltage) increases above its threshold voltage, the driving TFT 56 may increase the amount of its channel available to conduct electrical power, thereby increasing supply current flowing to the OLED 54. On the other hand, as the gate voltage decreases while still being above its threshold voltage, the driving TFT 56 may decrease amount of its channel available to conduct electrical power, thereby decreasing supply current flowing to the OLED 54. In this manner, the OLED display 12A may control luminance of the display pixel 40. The OLED display 12A may similarly control luminance of other display pixels 40 to display an image frame.

As described above, image data may include a voltage indicating desired luminance of one or more display pixels 40. Accordingly, operation of the one or more display pixels 40 to control luminance should be based at least in part on the image data. In the OLED display 12A, a driving TFT 56 may facilitate controlling luminance of a display pixel 40 by controlling magnitude of supply current flowing into its OLED 54. Additionally, the magnitude of supply current flowing into the OLED 54 may be controlled based at least in part on voltage supplied by a data line 46, which is used to charge the storage capacitor 52. However, since image data may be received from an image source, magnitude of the image data may be relatively small. Accordingly, to facilitate controlling magnitude of supply current, the source driver 34 may include one or more amplifiers (e.g., buffers) that amplify the image data to generate amplified image data with a voltage sufficient to control operation of the driving TFTs 56 in their active regions.

Figure 7:
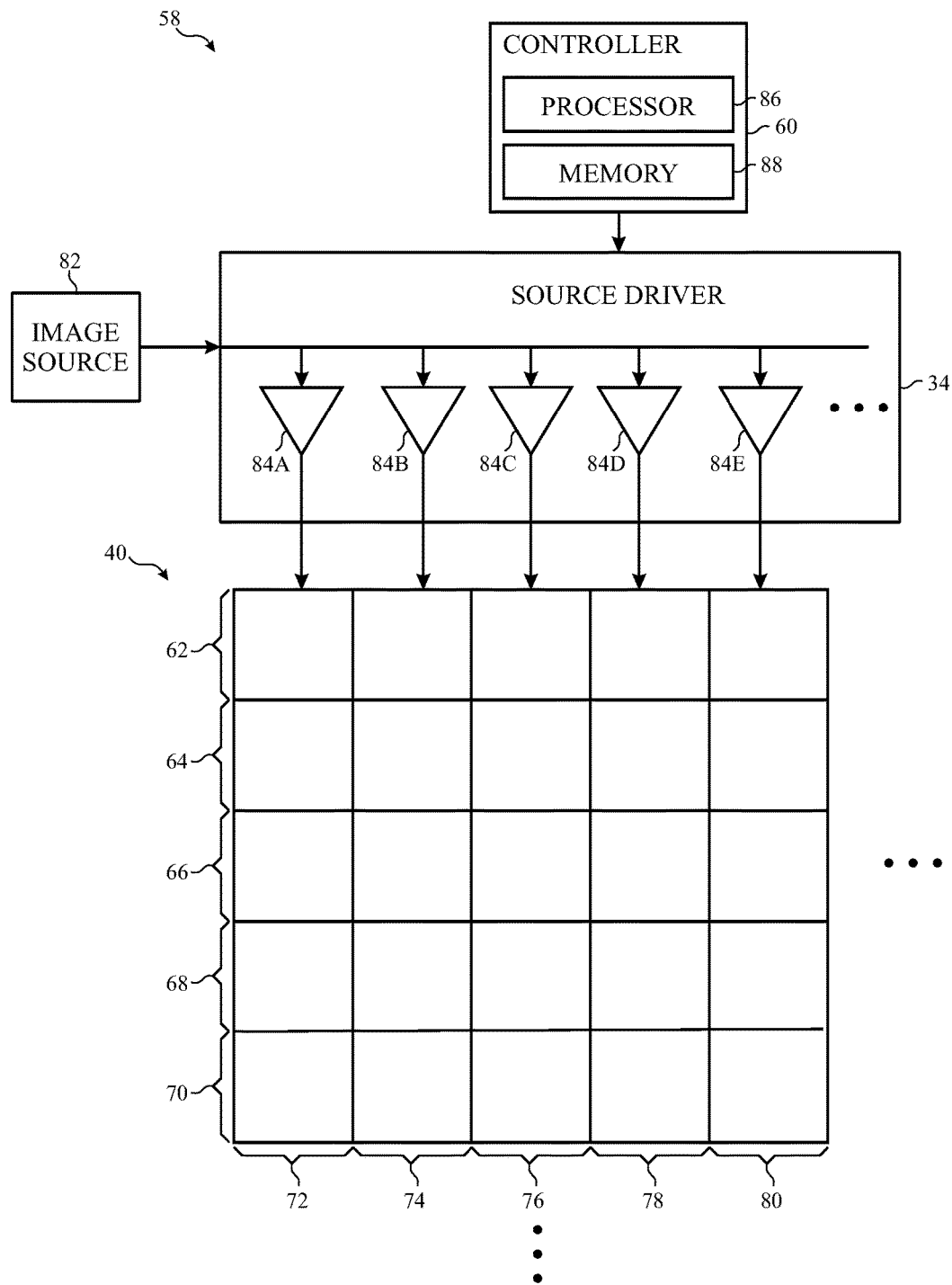
FIG. 7 is block diagram of a portion of the OLED electronic display of FIG. 6, in accordance with an embodiment.

To help illustrate, a more detailed view of a portion 58 of the OLED display 12A, which includes the source driver 34, multiple display pixels 40, and a controller 60, is described in FIG. 7. As described above, display pixels 40 may be arranged in rows and columns. In the depicted portion 58, the display pixels 40 are arranged into a first row 62, a second row 64, a third row 66, a fourth row 68, and a fifth row 70. Additionally, the display pixels are arranged into a first column 72, a second column 74, a third column 76, a fourth column 78, and a fifth column 80.

Furthermore, as depicted, the source driver 34 may receive image data from an image source 82, such as the processor 18, a graphics processing unit, the controller 60, a display pipeline, or the like. As described above, the source driver 34 may include one or more amplifiers (e.g., buffers) 84 that amplify the image data and generate amplified image data supplied to one or more display pixels 40. In some embodiments, each amplifier 84 may generate amplified image data for one column of display pixels 40. For example, in the depicted portion 58, the source driver 34 includes a first amplifier 84A that supplies amplified image data to the first column 72 of display pixels, a second amplifier 84B that supplies amplified image data to the second column 74 of display pixels, a third amplifier 84C that supplies amplified image data to the third column 76 of display pixels, a fourth amplifier 84D that supplies amplified image data to the fourth column 78 of display pixels, and a fifth amplifier 84D that supplies amplified image data to the fifth column 80 of display pixels.

In the depicted embodiment, the controller 60 may generally control operation of the source driver 34 and/or other portions of the electronic display 12. To facilitate controlling operating, the controller 60 may include a controller processor 86 and controller memory 88. More specifically, the controller processor 86 may execute instructions and/or process data stored in the controller memory 88 to control operation in the electronic display 12. Accordingly, in some embodiments, the controller processor 86 may be included in the processor 18 and/or separate processing circuitry and the memory 88 may be included in memory 20 and/or a separate tangible non-transitory computer-readable medium. Furthermore, in some embodiments, the controller 60 may be included in the source driver 34 (e.g., as a timing controller) or as separate discrete circuitry.

In some embodiments, the controller 60 may control operation of the electronic display 12 by instructing the amplifier 84 to generate amplified image data. More specifically, this may include instructing the each amplifier 84 to generate amplified image data using either a first (e.g., non-inverting) operational mode or a second (e.g., inverting) operational mode. As described above, each amplifier 84 may introduce noise when amplifying the image data to generate amplified image data due at least in part to intrinsic characteristics. In other words, regardless of whether an amplifier 84 operates in the first operational mode or the second operational mode, the amplifier 84 may introduce noise in generated amplified image data, which causes luminance variations in display pixels 40.

However, in some embodiments, the profile of the noise generated while operating in the first operational mode and the second operational mode may be different. In fact, in some embodiments, noise profile generated by operating in the first operational mode may be the inverse polarity of noise profiled generated by operating in the second operational mode. As such, taking advantage of luminance averaging by a human eye, perceptibility of luminance variations caused by noise introduced in the amplified image data may be reduced.

Figure 8:
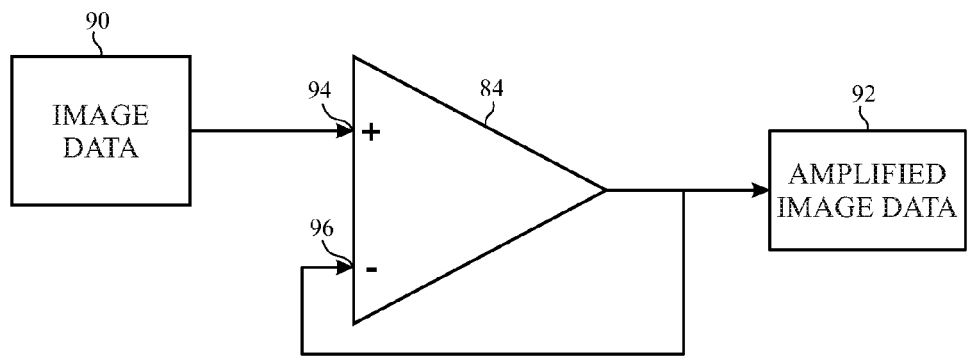
FIG. 8 is a block diagram of an amplifier used in the portion of the OLED electronic display of FIG. 7 operating in a first mode, in accordance with an embodiment.
Figure 9:
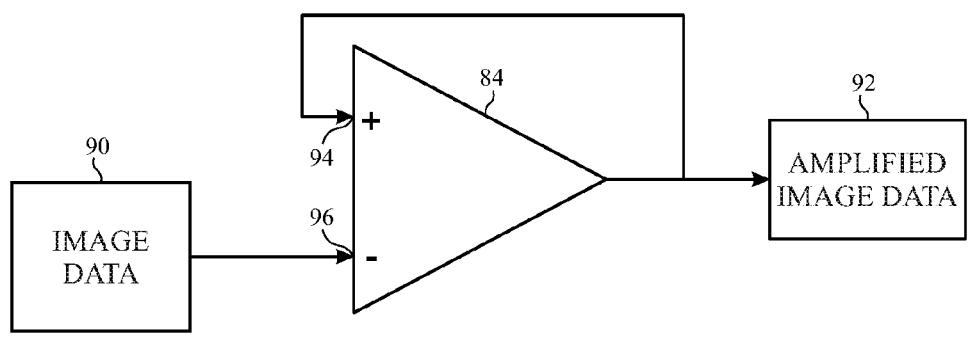
FIG. 9 is a block diagram of an amplifier used in the portion of the OLED electronic display of FIG. 7 operating in a second mode, in accordance with an embodiment.

To help illustrate, FIGS. 8 and 9 describe schematic diagrams of an amplifier 84 operating in two different operational modes. More specifically, FIG. 8 describes the amplifier 84 operating in a non-inverting (e.g., first) operational mode and FIG. 9 describes the amplifier 84 operating in an inverting (e.g., second) operational mode. As depicted, the amplifier 84 includes a non-inverting terminal 94 and an inverting terminal 96. Additionally, in both the non-inverting operational mode and the inverting operational mode, the amplifier 84 receives image data 90 at one terminal, outputs amplified image data 92, and receives a feedback of the amplified image data 92 at another terminal.

However, as depicted in FIG. 8, when operating in the non-inverting operational mode, the amplifier 84 receives the image data 90 at its non-inverting terminal 94 and the feedback of the amplifier image data 92 at its inverting terminal 96. On the other hand, as depicted in FIG. 9, when operating in the inverting operational mode, the amplifier 84 receives the image data at its inverting terminal 96 and the feedback of the amplified image data 92 at its non-inverting terminal 94. As described above, the amplifier 84 may introduce random noise in the amplified image data 92 regardless of whether operating in the non-inverting operational mode or the inverting operational mode. For example, when the desired amplified image data is 3V, the output amplified image data may be 3V plus some random noise between −5 mV and +5 mV.

Although the introduce noise may be random, the profile of the noise introduced when operating in the non-inverting operational mode may be different from the profile of the noise introduced when operating in the inverting operational mode. In some embodiments, the range of noise voltage may be different and/or the noise profiles may be the inverse of one another. For example, when operating in the non-inverting operational mode, the amplifier 84 may introduce random noise between −1 mV and 5 mV. On the other hand, when operating in the inverting operational mode, the amplifier 84 may introduce random noise between −5 mV and 1 mV. As such, perceptibility of luminance variations may be reduced by taking advantage of luminance averaging of the human eye.

Figure 10:
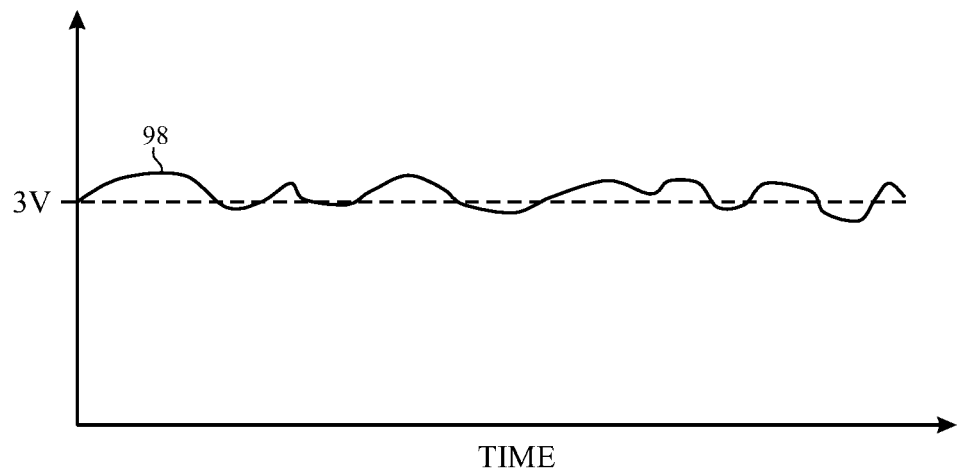
FIG. 10 is a plot of example amplified image data output by the amplifier of FIG. 8 operating in the first mode, in accordance with an embodiment.
Figure 11:
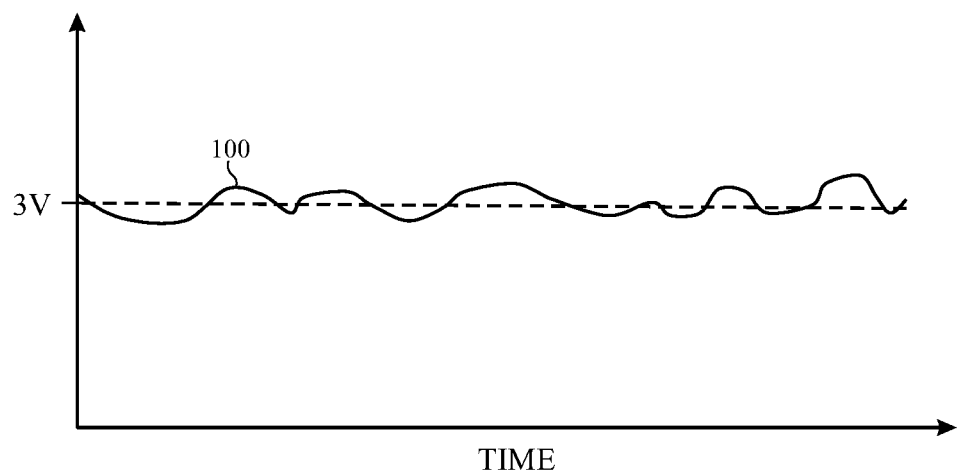
FIG. 11 is a plot of example amplifier image data output by the amplifier of FIG. 9 operating in the second mode, in accordance with an embodiment.

To help illustrate, FIGS. 10 and 11 describes examples of amplified image data output by the amplifier 84 when operating is two different operational modes. More specifically, FIG. 10 is a plot of a first amplified image data 98 output when the amplifier 84 is operating in the non-inverting operational mode over time. Additionally, FIG. 11 is a plot of a second amplified image data 100 output when the amplifier 84 is operating in the non-inverting operational mode over time.

In the described example, the desired amplified image data is 3 V. However, in both instances, the noise introduce in the amplifier 84 causes the output amplified image data 98 and 100 to vary from the desired 3 V. In fact, in the depicted embodiments, the noise introduce in the first amplified image data 98 is the inverse of noise introduce in the second amplified image data 100. For example, at one instance in time, the first amplified image data 98 may be 3.001 V while the second amplified image data 98 may be 2.999 V. In such an instance, a display pixel 40 receiving the first amplified image data 98 and a display pixel 40 receiving the second image data may still vary in luminance. However, due to luminance averaging of the human eye, the perceptibility of the luminance difference may be reduced and, in fact, may enable perceived luminance to be approximately equal to a desired luminance (e.g., luminance produced when 3 V is supplied).

It should be appreciated that the first amplified image data 98 and the second amplified image data 100 are merely a simplified example. In an actual implementation, the noise introduced in the first amplified image data 98 and noise introduced in the second amplified image data 100 may be random and, thus, not always an exact inverse of one another. Nevertheless, as the number of luminance averaged display pixels 40 increases, the likelihood of introduced noise canceling increases. Accordingly, driving schemes used to display image frames may be determined to increase number of luminance averaged display pixels 40. As described above, a driving scheme describes the operational mode with which amplifiers 84 generates amplified image data 92 used to control luminance of display pixels 40.

Figure 12:
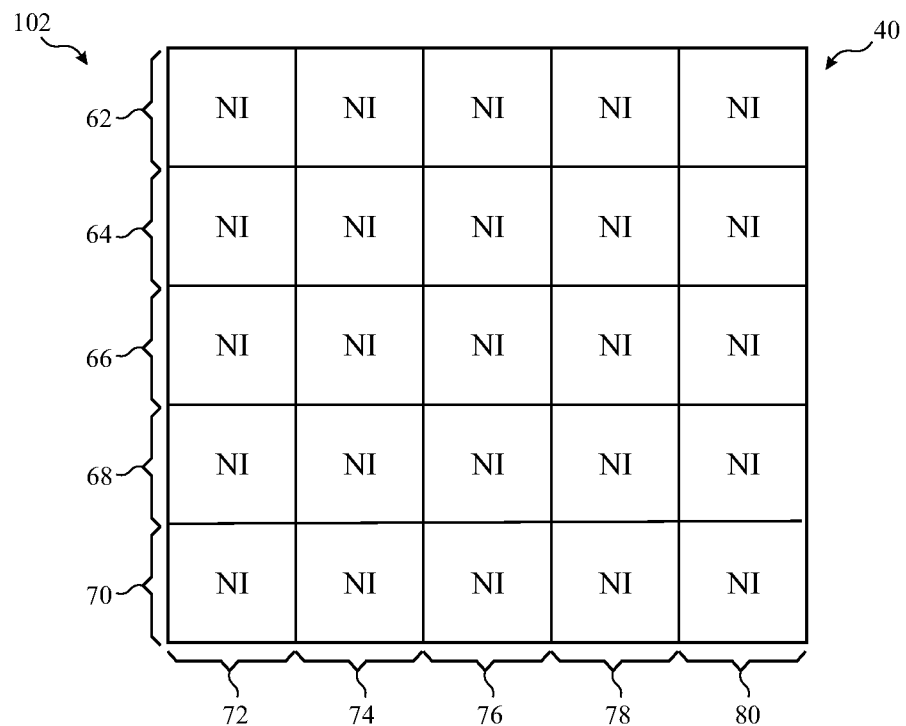
FIG. 12 is a diagrammatic representation of one driving scheme for the portion of the OLED display of FIG. 7, in accordance with an embodiment.
Figure 13:
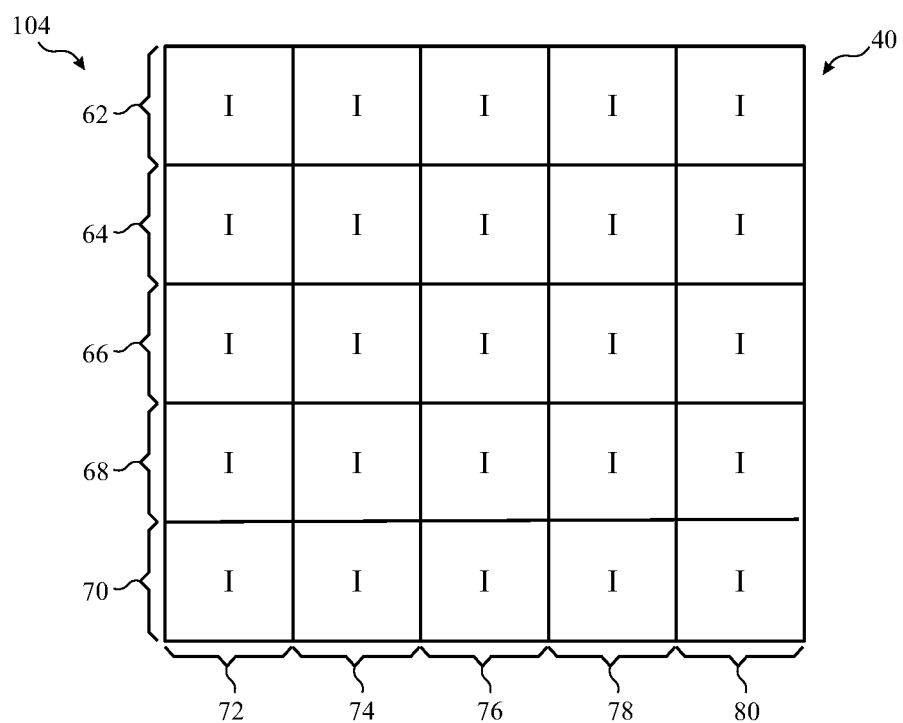
FIG. 13 is a diagrammatic representation of another driving scheme for the portion of the OLED display of FIG. 7, in accordance with an embodiment.

To help illustrate, FIGS. 12 and 13 describe examples of two driving schemes used to display image frames. More specifically, FIG. 12 describes a first driving scheme 102 and FIG. 13 describes a second driving scheme 104. In the depicted embodiment, the first driving scheme 102 and the second driving scheme 104 are described by the twenty-five display pixels 40 from FIG. 7 with an amplifier operational mode used to generate amplified image data supplied to each display pixel 40 superimposed thereon.

As depicted in FIG. 12, in the first driving scheme 102, each display pixel 40 may be supplied amplified image data 92 generated by amplifiers 84 operating in the non-inverting (e.g., first) operational mode. Accordingly, the controller 60 may instruct the first amplifier 84A, the second amplifier 84B, the third amplifier 84C, the fourth amplifier 84D, and the fifth amplifier 84E to operate in the non-inverting operational mode. On the other hand, as depicted in FIG. 13, each display pixel 40 may be supplied amplified image data 92 generated by amplifiers 84 operating in the inverting (e.g., second) operational mode. Accordingly, the controller may instruct the first amplifier 84A, the second amplifier 84B, the third amplifier 84C, the fourth amplifier 84D, and the fifth amplifier 84E to operate in the inverting operational mode.

In some embodiments, the controller 60 may instruct the amplifiers 84 to alternate between the first driving scheme 102 and the second driving scheme 104 when displaying successive image frames. For example, the controller 60 may instruct the amplifier 84 to use the first driving scheme 102 when displaying a first image frame and to use the second driving scheme 104 when successively displaying a second image frame. In such an instance, each display pixel 40 may display the first image frame based on amplified image data 92 generated by an amplifier 84 operating in the non-inverting operational mode and display the second image frame based on amplified image data 92 generated by the amplifier operating in the inverting operational mode.

When image frames are successively displayed, the human eye may temporally average luminance of multiple image frames. Additionally, as described above, luminance variations caused by operating the in the non-inverting operational mode and the inverting operational mode may average to reduce perceptibility of the luminance variations. Accordingly, alternating between the first driving scheme 102 and the second driving scheme 104 to display successive image frames may reduce perceivability of the luminance variations due to temporal luminance averaging.

However, the effectiveness of temporal luminance averaging may be directly related to refresh rate of the electronic display 12. For example, as refresh rate increases, the number of image frames temporally averaged by the human eye may increase, thereby reducing perceivability of the luminance variations. However, as refresh rate decreases, the number of image frames temporally averaged by the human eye may decrease, thereby increasing perceivability of luminance variations.

Thus, in addition to temporal luminance averaging, the likelihood of displaying perceivable luminance variations (e.g., visual artifacts) may be reduced using spatial luminance averaging. In fact, since spatial luminance averaging may average luminance of adjacent display pixels 40, driving schemes utilizing spatial luminance averaging may be less affected by refresh rate of the electronic display 12. Thus, such driving schemes may be particularly useful when the electronic display 12 operates with a lower refresh rate (e.g., 30 Hz).

Figure 14:
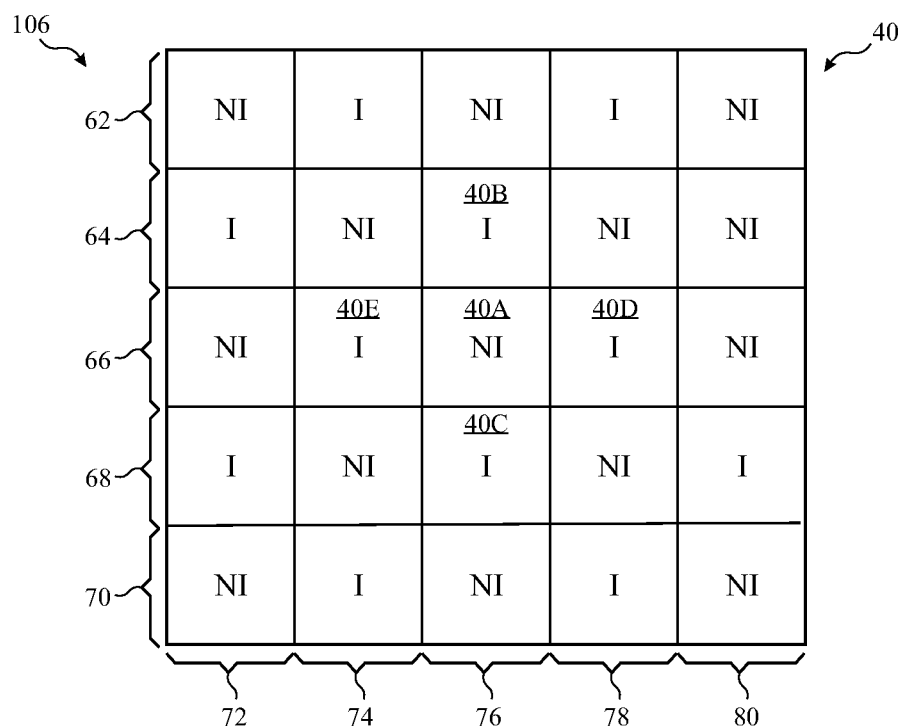
FIG. 14 is a diagrammatic representation of another driving scheme for the portion of the OLED display of FIG. 7, in accordance with an embodiment.

To help illustrate, FIG. 14 describes an examples of a third driving scheme 106 used to display image frames. In the depicted embodiment, the third driving scheme 106 is described by the twenty-five display pixels 40 from FIG. 7 with an amplifier operational mode used to generate amplified image data supplied to each display pixel 40 superimposed thereon. In the third driving scheme 106, each display pixel 40 may be supplied amplified image data 92 generated by a different operational mode than directly adjacent (e.g., directly above, directly below, directly to the left, or directly to the right) display pixels.

For example, in the depicted embodiment, a first display pixel 40A receives amplified image data generated by an amplifier 84 operating in the non-inverting operational mode. Additionally, a second display pixel 40B, directly above the first display pixel 40A, and a third display pixel 40C, directly below the first display pixel 40A, each receives amplified image data generated by the amplifier 84 operating in the inverting operational mode. Furthermore, a third display pixel 40D, directly to the left of the first display pixel 40A, and a fourth display pixel 40E, directly to the right of the first display pixel 40B, each receives amplified image data generated by amplifiers 84 operating in the inverting operational mode.

As described above, an amplifier 84 may generate amplified image data for a column of display pixels 40. Additionally, in some embodiments, amplified image data may be supplied to one row of display pixels 40 at a time. Thus, to display an image frame using the third driving scheme 106 in the depicted embodiment, the controller 60 may instruct the first amplifier 84A, the third amplifier 84C, and the fifth amplifier 84E to operate in the non-inverting operational mode and the second amplifier 84B and the fourth amplifier 84D to operate in the inverting operational mode when writing to the first row 62 of display pixels 62. Additionally, the controller 60 may instruct the first amplifier 84A, the third amplifier 84C, and the fifth amplifier 84E to operate in the inverting operational mode and the second amplifier 84B and the fourth amplifier 84D to operate in the non-inverting operational mode when writing to the second row 64 of display pixels 62. In a similar manner, the controller 60 may instruct the amplifiers 84 to operate in the non-inverting operational mode or the inverting operational mode when writing to the third row 66 of display pixels 40, the fourth row 68 of display pixels 40, and the fifth row 70 of display pixels 40.

When an image frame is displayed, the human eye may spatially average luminance of adjacent display pixels 40. Additionally, as described above, luminance variations caused by operating the in the non-inverting operational mode and the inverting operational mode may average to reduce perceptibility of the luminance variations. Accordingly, using the third driving scheme 106 to display an image frame may reduce perceivability of the luminance variations due to spatial luminance averaging.

As described above, the likelihood of displaying a perceptible luminance variation (e.g., a visual artifact) may be reduced by increasing number of display pixels 40 averaged together. Thus, in some embodiments, driving schemes may utilize both spatial and temporal luminance averaging to reduce perceivability of luminance variations.

Figure 15:
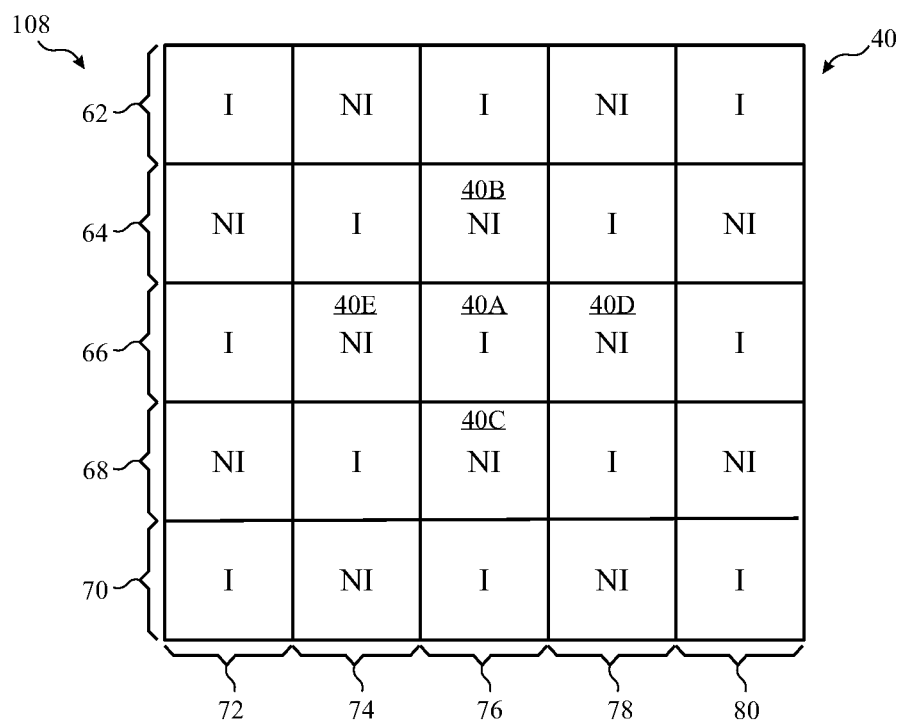
FIG. 15 is a diagrammatic representation of another driving scheme for the portion of the OLED display of FIG. 7, in accordance with an embodiment.

To help illustrate, FIG. 15 describes an examples of a fourth driving scheme 108 that may be used with the third driving scheme 106 to display image frames. In the depicted embodiment, the fourth driving scheme 108 is described by the twenty-five display pixels 40 from FIG. 7 with an amplifier operational mode used to generate amplified image data supplied to each display pixel 40 superimposed thereon.

Similar to the third driving scheme 108, in the fourth driving scheme 108, each display pixel 40 may be supplied amplified image data 92 generated by a different operational mode than adjacent (e.g., directly above, directly below, directly to the left, or directly to the right) display pixels to facilitate spatial luminance averaging. For example, in the depicted embodiment, the first display pixel 40A receives amplified image data generated by an amplifier 84 operating in the inverting operational mode. Additionally, the second display pixel 40B, directly above the first display pixel 40A, and a third display pixel 40C, directly below the first display pixel 40A, each receives amplified image data generated by the amplifier 84 operating in the non-inverting operational mode. Furthermore, the third display pixel 40D, directly to the left of the first display pixel 40A, and the fourth display pixel 40E, directly to the right of the first display pixel 40B, each receives amplified image data generated by amplifiers 84 operating in the non-inverting operational mode.

Thus, to display an image frame using the fourth driving scheme 108 in the depicted embodiment, the controller 60 may instruct the first amplifier 84A, the third amplifier 84C, and the fifth amplifier 84E to operate in the inverting operational mode and the second amplifier 84B and the fourth amplifier 84D to operate in the non-inverting operational mode when writing to the first row 62 of display pixels 62. Additionally, the controller 60 may instruct the first amplifier 84A, the third amplifier 84C, and the fifth amplifier 84E to operate in the non-inverting operational mode and the second amplifier 84B and the fourth amplifier 84D to operate in the inverting operational mode when writing to the second row 64 of display pixels 62. In a similar manner, the controller 60 may instruct the amplifiers 84 to operate in the non-inverting operational mode or the inverting operational mode when writing to the third row 66 of display pixels 40, the fourth row 68 of display pixels 40, and the fifth row 70 of display pixels 40.

Additionally, in the fourth driving scheme 108, each display pixel 40 may display an image frame using amplified image data generated by a different operational mode than amplified image data used to display a directly previous image frame to facilitate temporal averaging. As such, in some embodiments, the controller 60 may instruct amplifiers 84 to alternate between the third driving scheme 106 and the fourth driving scheme 108 when displaying successive image frames.

For example, the controller 60 may instruct the amplifiers 84 to use the third driving scheme 106 when displaying a first image frame and to use the fourth driving scheme 109 when successively displaying a second image frame. In such an embodiment, to display the first image frame, the first display pixel 40A may emit light based on amplified image data 92 generated by an amplifier 84 operating in the non-inverting operational mode while its directly adjacent display pixels 40 (e.g., second display pixel 40B, third display pixel 40C, the fourth display pixel 40D, and fifth display pixel 40E) emit light based on amplified image data 92 generated by amplifiers 84 operating in the inverting operational mode. As such luminance of the first display pixel 40A in the first image frame may be spatially averaged with its directly adjacent display pixels 40 to reduce perceivability of luminance variations caused by amplifier 84 introduced noise.

To display the second image frame, the first display pixel 40A may emit light based on amplified image data 92 generated by an amplifier 84 operating in the inverting operational mode while its directly adjacent display pixels 40 (e.g., second display pixel 40B, third display pixel 40C, the fourth display pixel 40D, and fifth display pixel 40E) emit light based on amplified image data 92 generated by amplifiers 84 operating in the non-inverting operational mode. As such luminance of the first display pixel 40A in the second image frame may also be spatially averaged with its directly adjacent display pixels 40. Additionally, since the first display pixel 40A displays the first image frame using amplified image data 92 generated in the non-inverting mode and the second image frame using amplified image data 92 generated in the inverting mode, luminance of the first display pixel 40A in the first image frame and the second image frame may temporally average to further reduce perceivability of luminance variations caused by amplifier 84 introduced noise.

It should be appreciated that the described driving schemes (e.g., first driving scheme 102, second driving scheme 104, third driving scheme 106, and fourth driving scheme 108) are merely intended to be illustrative. In other words, other driving schemes may be used to reduce likelihood of displaying luminance variations perceivable by a human eye (e.g., a perceivable visual artifact). As described above, such driving schemes may utilize temporal luminance averaging, spatial luminance averaging, or both.

Figure 16:
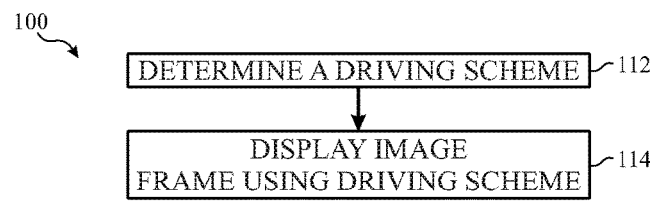
FIG. 16 is a flow diagram of a process for operating the OLED electronic display of FIG. 6, in accordance with an embodiment.

One embodiment of a process 110 for utilizing a drive scheme to reduce likelihood of displaying perceivable luminance variations is described in FIG. 16. Generally, the process 110 includes determining a driving scheme (process block 112) and displaying an image frame using the driving scheme. In some embodiments, the process 110 may be implemented by instructions stored in a tangible, non-transitory, computer-readable medium, such as memory 20, storage device 22, controller memory 88, or the like, that are executable by processing circuitry, such as processor 18, controller processor 86, or the like.

Accordingly, in such embodiments, the controller 60 may determine the driving scheme (process block 112). In some embodiments, the driving scheme may be stored in the computing device 10, for example, in memory 20, storage device 22, and/or controller memory 88. Thus, the controller 60 may determine the driving scheme by retrieving it from the computing device 10.

In some embodiments, the driving scheme may be predetermined and stored in the computing device 10 by a manufacturer. Additionally or alternatively, the computing device 10 may determine and store the driving scheme. For example, in some embodiments, the computing device 10 may run a calibration process on the electronic display 12 to determine noise profile introduced by the amplifiers 84 in different operational modes and determine the driving scheme accordingly.

Additionally, in some embodiments, the computing device 10 may store multiple driving schemes. As such, the controller 60 may select and/or modify one of the stored driving schemes based at least in part on operational parameters of the electronic display 12, such as refresh rate, desired image quality, desired power consumption, and/or number of driving schemes selected. For example, when only one driving scheme is selected and/or refresh rate of electronic display 12 is low (e.g., 30 Hz), the controller 60 may select a driving scheme that facilitates spatial luminance averaging to reduce likelihood of display perceivable luminance variations. Thus, the controller 60 may select the third driving scheme 106 described in FIG. 14 or the fourth driving scheme 108 described in FIG. 15. However, the controller 60 select any driving scheme that instructs amplifiers 84 to generate amplified image data 92 supplied to a display pixel 40 using an operational mode different from the operational mode used to generate amplified image data 92 supplied to one or more directly adjacent display pixels 40.

The controller 60 may then instruct the electronic display 12 to display an image frame using the driving scheme (process block 114). In some embodiments, the controller 60 may instruct the amplifiers 84 to generate amplified image data 92 supplied to display pixels 40 in accordance with the driving scheme to display the image frame. For example, when using the third driving scheme 106 to display the image frame, the controller 60 may instruct the first amplifier 84A, the third amplifier 84C, and the fifth amplifier 84E to operate in the non-inverting operational mode and the second amplifier 84B and the fourth amplifier 84D to operate in the inverting operational mode when writing to the first row 62 of display pixels 62. Additionally, the controller 60 may instruct the first amplifier 84A, the third amplifier 84C, and the fifth amplifier 84E to operate in the inverting operational mode and the second amplifier 84B and the fourth amplifier 84D to operate in the non-inverting operational mode when writing to the second row 64 of display pixels 62, and so on. In this manner, luminance of at least one display pixel 40 may spatially average with luminance of at least one adjacent display pixel used to display the image frame.

As such, the displayed image quality of the electronic display 12 may be improved by using spatial luminance averaging to reduce likelihood of displaying perceivable luminance variations (e.g., visual artifacts). As described above, in addition to spatial luminance averaging, temporal luminance averaging may also facilitate reducing likelihood of displaying perceivable luminance variations. In some embodiments, temporal luminance averaging may be enabled by utilizing multiple different driving schemes.

Figure 17:
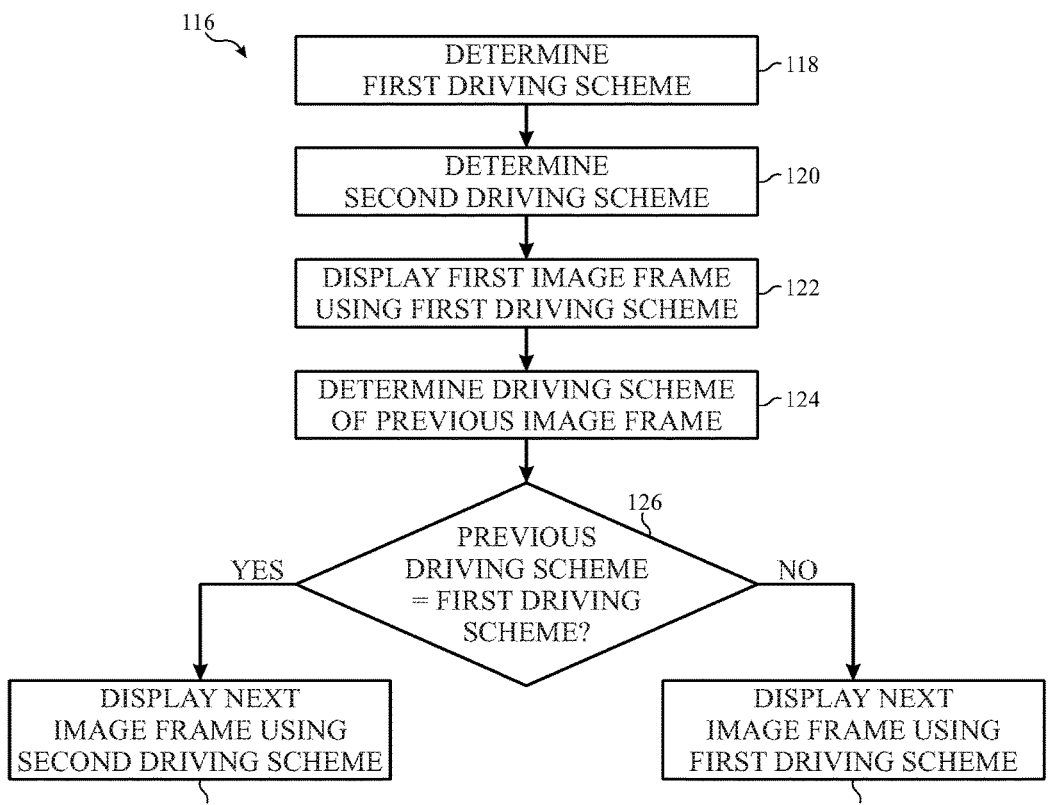
FIG. 17 is a flow diagram of another process for operating the OLED electronic display of FIG. 6, in accordance with an embodiment.

One embodiment of a process 116 utilizing multiple different drive schemes to reduce likelihood of displaying perceivable luminance variations is described in FIG. 17. Generally, the process 116 includes determining a first driving scheme (process block 118), determining a second driving scheme (process block 120), displaying a first image frame using the first driving scheme (process block 122), determining driving scheme used to display a previous image frame (process block 124), determining whether the previous driving scheme is the first driving scheme (decision block 126), displaying a next image frame using the second driving scheme when the previous driving scheme is the first driving scheme (process block 128), and displaying the next image frame using the first driving scheme when the previous driving scheme is not the first driving scheme (process block 130). In some embodiments, the process 116 may be implemented by instructions stored in a tangible, non-transitory, computer-readable medium, such as memory 20, storage device 22, controller memory 88, or the like, that are executable by processing circuitry, such as processor 18, controller processor 86, or the like.

Accordingly, in such embodiments, the controller 60 may determine the first driving scheme (process block 118) and determine the second driving scheme (process block 120). As used in regard to the process 116 of FIG. 17, the first driving scheme and the second driving scheme are merely intended to describe two different driving schemes and not necessarily the first driving scheme 102 described in FIG. 12 and the second driving scheme 104 described in FIG. 13. In some embodiments, the first driving scheme and the second driving scheme may be stored in the computing device 10, for example, in memory 20, storage device 22, and/or controller memory 88. Thus, the controller 60 may determine the first driving scheme and the second driving scheme by retrieving them from the computing device 10.

In some embodiments, the first driving scheme and/or the second driving scheme may be predetermined and stored in the computing device 10 by a manufacturer. Additionally or alternatively, the computing device 10 may determine and store the first driving scheme and/or the second driving scheme. For example, in some embodiments, the computing device 10 may run a calibration process on the electronic display 12 to determine noise profile introduced by the amplifiers 84 operating in different operational modes and determine the first driving scheme and/or the second driving scheme accordingly.

Additionally, in some embodiments, the computing device 10 may store multiple driving schemes. As such, the controller 60 may select and/or modify two of the stored driving schemes based at least in part on operational parameters of the electronic display 12, such as refresh rate, desired image quality, desired power consumption, and/or number of driving schemes selected. For example, when two driving scheme are selected and/or refresh rate of electronic display 12 is high (e.g., 60 Hz), the controller 60 may select two driving schemes that facilitate temporal luminance averaging to reduce likelihood of displaying perceivable luminance variations. Thus, in some embodiments, the controller 60 may select the first driving scheme 102 described in FIG. 12 as the first driving scheme and the second driving scheme 104 described in FIG. 13 as the second driving scheme. However, the controller 60 select any two driving schemes that instructs amplifiers 84 to generate amplified image data 92 supplied to a display pixel 40 for display of an image frame using an operational mode different from the operational mode used to generate amplified image data 92 supplied to the display pixel 40 for display of a directly previous image frame.

As described above, to further reduce likelihood of displaying perceivable luminance variations, the controller 60 that facilitate both spatial luminance averaging and temporal luminance averaging. Thus, in some embodiments, the controller may select the third driving scheme 106 described in FIG. 14 as the first driving scheme and the fourth driving scheme 108 described in FIG. 15 as the second driving scheme. However, the controller 60 select any two driving schemes that instructs amplifiers 84 both to generate amplified image data 92 supplied to a display pixel 40 for display of an image frame using an operational mode different from the operational mode used to generate amplified image data 92 supplied to the display pixel 40 for display of a directly previous image frame and to generate amplified image data 92 supplied to a display pixel 40 using an operational mode different from the operational mode used to generate amplified image data 92 supplied to one or more directly adjacent display pixels 40.

The controller 60 may then instruct the electronic display 12 to display a first image frame using the first driving scheme (process block 122). In some embodiments, the controller 60 may instruct the amplifiers 84 to generate amplified image data 92 supplied to display pixels 40 in accordance with the first driving scheme to display the first image frame. For example, when using the third driving scheme 106 to display the first image frame, the controller 60 may instruct the first amplifier 84A, the third amplifier 84C, and the fifth amplifier 84E to operate in the non-inverting operational mode and the second amplifier 84B and the fourth amplifier 84D to operate in the inverting operational mode when writing to the first row 62 of display pixels 62. Additionally, the controller 60 may instruct the first amplifier 84A, the third amplifier 84C, and the fifth amplifier 84E to operate in the inverting operational mode and the second amplifier 84B and the fourth amplifier 84D to operate in the non-inverting operational mode when writing to the second row 64 of display pixels 62, and so on. In this manner, luminance of at least one display pixel 40 used to display may spatially average with luminance of at least one adjacent display pixel when displaying the next image frame.

Subsequently, the controller 60 may determine the driving scheme used to display a directly previous image frame (process block 124). In some embodiments, the controller 60 may store an indication (e.g., flag) of the previous driving scheme in the controller memory 88. For example, a flag may be set to "0" when the previous driving scheme is the first driving scheme and "1" when the previous driving scheme is the second driving scheme. Accordingly, in such embodiments, the controller 60 may retrieve the flag value to determine the previous driving scheme.

The controller 60 may then determine whether the previous driving scheme is the first driving scheme (decision block 126). Continuing with the above example, the controller 60 may determine that the previous driving scheme is the first driving scheme when the flag value is "0." On the other hand, the controller 60 may determine that the previous driving scheme is not the first driving scheme when the flag value is "1."

When the previous driving scheme is the first driving scheme, the controller 60 may instruct the electronic display 12 to display the next image frame using the second driving scheme (process block 128). In some embodiments, the controller 60 may instruct the amplifiers 84 to generate amplified image data 92 supplied to display pixels 40 in accordance with the second driving scheme to display the next image frame. For example, when using the fourth driving scheme 108 to display the next frame, the controller 60 may instruct the first amplifier 84A, the third amplifier 84C, and the fifth amplifier 84E to operate in the non-inverting operational mode and the second amplifier 84B and the fourth amplifier 84D to operate in the inverting operational mode when writing to the second row 64 of display pixels 62, and so on. In this manner, luminance of at least one display pixel 40 used to display the next image frame may temporally average with luminance of the at least one display pixel 40 used to display the previous image frame. Moreover, luminance of at least one display pixel 40 may spatially average with luminance of at least one adjacent display pixel when displaying the next image frame.

On the other hand, when the previous driving scheme is not the first driving scheme, the controller 60 may instruct the electronic display 12 to display the next image frame using the first driving scheme (process block 128). Since two driving schemes are used, the previous driving frame not being the first driving scheme may imply that the previous driving scheme is the second driving scheme. Thus, in some embodiments, the controller 60 may instruct the amplifiers 84 to generate amplified image data 92 supplied to display pixels 40 in accordance with the first driving scheme. For example, when using the third driving scheme 106 to display the next image frame, the controller 60 may instruct the first amplifier 84A, the third amplifier 84C, and the fifth amplifier 84E to operate in the non-inverting operational mode and the second amplifier 84B and the fourth amplifier 84D to operate in the inverting operational mode when writing to the first row 62 of display pixels 62. Additionally, the controller 60 may instruct the first amplifier 84A, the third amplifier 84C, and the fifth amplifier 84E to operate in the inverting operational mode and the second amplifier 84B and the fourth amplifier 84D to operate in the non-inverting operational mode when writing to the second row 64 of display pixels 62, and so on. In this manner, luminance of at least one display pixel 40 used to display the next image frame may temporally average with luminance of the at least one display pixel 40 used to display the previous image frame. Moreover, luminance of at least one display pixel 40 may spatially average with luminance of at least one adjacent display pixel when displaying the next image frame.

Although process 116 is described with regard to two different driving schemes, one of ordinary skill in the art should understand that in other embodiments more than two driving schemes may used. For example, in some embodiments, the electronic display 12 may alternate between three or more driving schemes to employ different variations of spatial luminance averaging and/or temporal luminance averaging. Additionally, in some embodiments, the electronic display 12 may adjust the pattern of the driving schemes to employ different variations of spatial luminance averaging and/or temporal luminance averaging. For example, the electronic display 12 may display a first image frame using a first driving scheme, a second image frame using the first driving scheme, a third image frame with a second driving scheme, a fourth image frame using the second driving scheme, a fifth image frame using the first driving scheme, and so on.

Accordingly, the technical effects of the present disclosure include improving displayed image quality of an electronic display by reducing likelihood of displaying perceivable visual artifacts. In some embodiments, luminance variations in display pixels may result from noise introduced by amplifiers that amplify image data supplied to the display pixels. To reduce perceivability of luminance variations caused by amplifier noise, operational modes of the amplifiers may be determined to take advantage of luminance averaging of a human eye. For example, amplifiers supplying amplified image data to adjacent display pixels may utilize different operational modes so that spatial luminance averaging of the human eye may reduce perceptibility of any luminance variations. Additionally, an amplifier supplying amplified image data to a display pixel may utilize different operational modes than used for directly previously and/or directly subsequent image frames so that temporal luminance averaging of the human eye may reduce perceptibility of any luminance variations.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising an electronic display, wherein the electronic display comprises:
  a display panel comprising a first display pixel and a second display pixel directly adjacent the first display pixel, wherein:
    the first display pixel is configured to facilitate displaying a first image frame by controlling light emission based at least in part on first amplified image data; and
    the second display pixel is configured to facilitate displaying the first image frame by controlling light emission based at least in part on second amplified image data; and
  a source driver comprising a first amplifier communicatively coupled to the first display pixel and a second amplifier communicatively coupled to the second display pixel, wherein the source driver is configured to:

receive first image data corresponding with the first image frame and second image data corresponding with the first image frame;

operate the first amplifier in a first operational mode to generate the first amplified image data based on the first image data;

operate the second amplifier in a second operational mode different from the first operational mode to generate the second amplified image data based on the second image data when the first image frame is to be displayed using a first refresh rate; and operate the second amplifier in the first operational mode to generate the second amplified image data based on the second image data when the first image frame is to be displayed using a second refresh rate greater than the first refresh rate.

2. The electronic device of claim 1, wherein the source driver is configured to:

operate the first amplifier in the first operational mode by inputting the first image data to a first non-inverting terminal of the first amplifier and communicatively coupling a first output of the first amplifier to a first inverting terminal of the first amplifier;

operate the second amplifier in the second operational mode by inputting the second image data to a second inverting terminal of the second amplifier and communicatively coupling a second output of the second amplifier to a second non-inverting terminal of the second amplifier; and operate the second amplifier in the first operational mode by inputting the second image data to the second non-inverting terminal of the second amplifier and communicatively coupling the second output of the second amplifier to the second inverting terminal of the second amplifier.

3. The electronic device of claim 1, wherein the source driver is configured to:

operate the first amplifier in the first operational mode by inputting the first image data to a first inverting terminal of the first amplifier and communicatively coupling a first output of the first amplifier to a first non-inverting terminal of the first amplifier;

operate the second amplifier in the second operational mode by inputting the second image data to a second non-inverting terminal of the second amplifier and communicatively coupling a second output of the second amplifier to a second inverting terminal of the second amplifier; and operate the second amplifier in the first operational mode by inputting the second image data to the second inverting terminal of the second amplifier and communicatively coupling the second output of the second amplifier to the second non-inverting terminal of the second amplifier.

4. The electronic device of claim 1, wherein:

the first display pixel is configured to facilitate displaying a second image frame directly after the first image frame by controlling light emission based at least in part on third amplified image data;

the second display pixel is configured facilitate displaying the second image frame by controlling light emission based at least in part on fourth amplified image data; and the source driver is configured to:

receive third image data corresponding with the second image frame and fourth image data corresponding with the second image frame;

operate the second amplifier in the second operational mode to generate the third amplified image data based on the third image data;

operate the first amplifier in the second operational mode to generate the fourth amplified image data based on the fourth image data when a target refresh rate corresponding with the second image frame is less than a threshold refresh rate; and operate the second amplifier in the first operational mode to generate the fourth amplified image data based on the fourth image data when the target refresh rate corresponding with the second image frame is not less than the threshold refresh rate.

5. The electronic device of claim 4, wherein:

the target refresh rate corresponding with the second image frame is less than the threshold refresh rate when the target refresh rate is 30 Hz; and the target refresh rate corresponding with the second image frame is not less than the threshold refresh rate when the target refresh rate is 60 Hz.

6. The electronic device of claim 1, wherein:

the first operational mode is a non-inverting operational mode and the second operational mode is an inverting operational mode; or the first operational mode is the inverting operational mode and the second operational mode is the non-inverting operational mode.

7. The electronic device of claim 1, wherein:

the first refresh rate is 30 Hz; and the second refresh rate is 60 Hz.

8. The electronic device of claim 1, wherein the electronic display comprises a controller programmed to:

determine a target refresh rate corresponding with the first image frame;

instruct the source driver to implement a first driving scheme that facilitates spatially averaging luminance variations resulting from noise introduced by the source driver when the target refresh rate is less than a threshold refresh rate; and instruct the source driver to implement a second driving scheme that facilitate temporally averaging the luminance variations resulting from noise introduced by the source driver when the target refresh rate is not less than the threshold refresh rate.

9. The electronic device of claim 1, wherein the electronic device comprises a portable phone, a media player, a personal data organizer, a handheld game platform, a tablet device, a computer, or any combination thereof.

10. The electronic device of claim 1, wherein the electronic display comprises an active matrix organic light emitting diode display.

11. A tangible, non-transitory computer-readable medium that stores instructions executable by at least one processor of an electronic display, wherein the instructions comprise instructions to:

determine, using the at least one processor, a first refresh rate with which a first image frame is to be display on the electronic display;

instruct, using the at least one processor, a source driver in the electronic display to generate first amplified image data by implementing a first driving scheme to amplify first image data corresponding with the first image frame when the first refresh rate is less than a threshold refresh rate;

instruct, using the at least one processor, the source driver to generate the first amplified image data by implementing a second driving scheme different from the first driving scheme to amplify the first image data corresponding with the first image frame when the first refresh rate is not less than the threshold refresh rate; and instruct, using the at least one processor, one or more display pixels in the electronic display to store the first amplified image data to enable each of the one or more display pixels to control current flow through a corresponding organic light emitting diode based at least in part on the first amplified image data.

12. The tangible, non-transitory computer-readable medium of claim 11, comprising instructions to:
   determine, using the at least one processor, that the first refresh rate is less than the threshold refresh rate when the first refresh rate is 30 Hz; and
   determine, using the at least one processor, that the first refresh rate is not less than the threshold refresh rate when the first refresh rate is 60 Hz.

13. The tangible, non-transitory computer-readable medium of claim 11, wherein:
   the instructions to instruct the source driver to generate the first amplified image data by implementing the first driving scheme comprises instructions to:
      instruct the source driver to operate a first amplifier in a first operational mode to generate the first amplified image data corresponding with a first display pixel; and
      instruct the source driver to operate a second amplifier in a second operational mode different from the first operational mode to generate the first amplified image data corresponding with a second display pixel directly adjacent the first display pixel; and
   the instruction to instruct the source driver to generate the first amplified image data by implementing the second driving scheme comprises instructions to:
      instruct the source driver to operate the first amplifier to operate in the first operational mode to generate the first amplified image data corresponding with the first display pixel; and
      instruct the source driver to operate the second amplifier in the first operational mode to generate the first amplified image data corresponding with the second display pixel.

14. The tangible, non-transitory computer-readable medium of claim 11, comprising instructions to:
   determine, using the at least one processor, a second refresh rate with which a second image frame is to be displayed on the electronic display directly after the first image frame;
   instruct, using the at least one processor, the source driver to generate second amplified image data by implementing the first driving scheme to amplify second image data corresponding with the second image frame when the second refresh rate is less than the threshold refresh rate;
   instruct, using the at least one processor, the source driver to generate the second amplified image data by implementing a third driving scheme different from the first driving scheme and the second driving scheme to amplify the second image data corresponding with the second image frame when the second refresh rate is not less than the threshold refresh rate; and
   instruct, using the at least one processor, the one or more display pixels to store the second amplified image data to enable each of the one or more display pixels to control current flow through the corresponding organic light emitting diode based at least in part on the second amplified image data.

15. The tangible, non-transitory computer-readable medium of claim 14, wherein:
   the instructions to instruct the source driver to generate the first amplified image data by implementing the second driving scheme comprise instructions to:
      instruct the source driver to operate a first amplifier to operate in a non-inverting operational mode to generate the first amplified image data corresponding with a first display pixel; and
      instruct the source driver to operate a second amplifier to operate in an inverting operational mode to generate the first amplified image data corresponding with a second display pixel directly adjacent the first display pixel; and
   the instructions to instruct the source driver to generate the second amplified image data by implementing the third driving scheme comprise instructions to:
      instruct the source driver to operate the first amplifier in the inverting operational mode to generate the second amplified image data corresponding with the first display pixel; and
      instruct the source driver to operate the second amplifier in the non-inverting operational mode to generate the second amplified image data corresponding with the second display pixel.

16. A method comprising:
   determining, using a controller, a first refresh rate with which a first image frame is to be display on an electronic display;
   instructing, using the controller, a source driver in the electronic display to generate first amplified image data based on first image data corresponding with the first image frame by operating a first amplifier in a first operational mode;
   instructing, using the controller, the source driver to generate second amplified image data based on second image data corresponding with the first image frame by:
      operating a second amplifier in a second operational mode different from the first operational mode when the first refresh rate is less than a threshold refresh rate; and
      operating the second amplifier in the first operational mode when the first refresh rate is not less than the threshold refresh rate;
   instructing, using the controller, a first display pixel to store the first amplified image data to enable the first display pixel to control current flow through a first organic light emitting diode based at least in part on the first amplified image data; and
   instructing, using the controller, a second display pixel the first display pixel to store the second amplified image data to enable the second display pixel to control current flow through a second organic light emitting diode based at least in part on the second amplified image data.

17. The method of claim 16, wherein:
   instructing the source driver to generate the first amplified image data comprises:
      instructing the source driver to supply the first amplifier to input first image data to a first non-inverting terminal of the first amplifier; and instructing the source driver to communicatively couple a first output of the first amplifier to a first inverting terminal of the first amplifier;
instructing the source driver to generate the second amplified image data when the first refresh rate is not less than the threshold refresh rate comprises:
instructing the source driver to supply the second image data to a second non-inverting terminal of the second amplifier; and
instructing the source driver to communicatively couple a second output of the second amplifier to a second inverting terminal of the second amplifier; and
instructing the source driver to generate the second amplified image data when the first refresh rate is less than the threshold refresh rate comprises:
instructing the source driver to supply the second image data to the second inverting terminal of the second amplifier; and
instructing the source driver to communicatively couple the second output of the second amplifier to the second non-inverting terminal of the second amplifier.

18. The method of claim 16, wherein:
instructing the source driver to generate the first amplified image data comprises:
instructing the source driver to supply the first image data to a first inverting terminal of the first amplifier; and
instructing the source driver to communicatively couple a first output of the first amplifier to a first non-inverting terminal of the first amplifier;
instructing the source driver to generate the second amplified image data when the first refresh rate is not less than the threshold refresh rate comprises:
instructing the source driver to supply the second image data to a second inverting terminal of the second amplifier; and
instructing the source driver to communicatively couple a second output of the second amplifier to a second non-inverting terminal of the second amplifier; and
instructing the source driver to generate the second amplified image data when the first refresh rate is less than the threshold refresh rate comprises:
instructing the source driver to supply the second image data to the second non-inverting terminal of the second amplifier; and
instructing the source driver to communicatively couple the second output of the second amplifier to the second inverting terminal of the second amplifier.

19. The method of claim 16, comprising:
determining, using the controller, a second refresh rate with which a second image frame is to be display on an electronic display directly after the first image frame;
instructing, using the controller, the source driver to generate third amplified image data based on third image data corresponding with the second image frame by:
operating the first amplifier in the first operational mode when the second refresh rate is less than the threshold refresh rate; and
operating the first amplifier in the second operational mode when the second refresh rate is not less than the threshold refresh rate;
instructing, using the controller, the source driver to generate fourth amplified image data based on fourth image data corresponding with the second image frame by operating the second amplifier in the second operational mode;
instructing, using the controller, the first display pixel to store the third amplified image data to enable the first display pixel to control current flow through the first organic light emitting diode based at least in part on the third amplified image data; and
instructing, using the controller, the second display pixel to store the fourth amplified image data to enable the second display pixel to control current flow through the second organic light emitting diode based at least in part on the fourth amplified image data.

20. An electronic display comprising:
a display panel, wherein the display panel comprises a plurality of display pixels configured to facilitate displaying a first image frame by controlling light emission based at least in part on first amplified image data;
a source driver coupled to the plurality of display pixels, wherein the source driver is configured to:
receive first image data corresponding with the first image frame from an image source; and
generate the first amplified image data by amplifying the first image data; and
a controller communicatively coupled to the source driver, wherein the controller is configured to:
instruct the source driver to generate the first amplified image data by implementing a first driving scheme when the first image frame is to be displayed using a first refresh rate; and
instruct the source driver to generate the first amplified image data by implementing a second driving scheme different from the first driving scheme when the first image frame is to be displayed using a second refresh rate greater than the first refresh rate.

21. The electronic display of claim 20, wherein:
the plurality of display pixels comprise a first display pixel and a second display pixel directly adjacent the first display pixel; and
the source driver comprise a first amplifier communicatively coupled to the first display pixel and a second amplifier communicatively coupled to the second display pixel, wherein
the first amplifier is configured to generate the first amplified image data corresponding with the first display pixel by operating in a first operational mode; and
the second amplifier is configured to:
generate the first amplified image data corresponding with the second display pixel by operating in the first operational mode when the source driver implements the second driving scheme; and
generate the first amplified image data corresponding with the second display pixel by operating in a second operational model different from the first operational mode when the source driver implements the first driving scheme.

22. The electronic display of claim 20, wherein the electronic display comprises an active matrix organic light emitting diode display.

23. The electronic display of claim 20, wherein:
the first refresh rate is 30 Hz; and
the second refresh rate is 60 Hz.

24. The electronic display of claim 23, wherein:
the plurality of display pixels are configured to facilitate displaying a second image frame directly after the first image frame by controlling light emission based at least in part on second amplified image data;

the source driver is configured to:
- receive second image data corresponding with the second image frame from the image source; and
- generate the second amplified image data by amplifying the second image data; and the controller is configured to:
- determine a target refresh rate corresponding with the second image frame;
- instruct the source driver to generate the second amplified image data by implementing the first driving scheme when the target refresh rate is less than a threshold refresh rate; and
- instruct the source driver to generate the second amplified image data by implementing a third driving scheme different from the first driving scheme and the second driving scheme when the target refresh rate is not less than the threshold refresh rate.

25. The electronic display of claim 24, wherein:

the plurality of display pixels comprise a first display pixel and a second display pixel directly adjacent the first display pixel; and the source driver comprise a first amplifier communicatively coupled to the first display pixel and a second amplifier communicatively coupled to the second display pixel, wherein:

the source driver is configured to implement the second driving scheme by:
- operating the first amplifier in a non-inverting operational mode to generate the first amplified image data corresponding with the first display pixel; and
- operating the second amplifier in an inverting operational mode to generate the first amplified image data corresponding with the second display pixel; and the source driver is configured to implement the second driving scheme by:
- operating the first amplifier in the inverting operational mode to generate the second amplified image data corresponding with the first display pixel; and
- operating the second amplifier in the non-inverting operational mode to generate the second amplified image data corresponding with the second display pixel.

* * * * *

UNITED STATES PATENT AND TRADEMARK OFFICE
CERTIFICATE OF CORRECTION

PATENT NO. : 10,002,570 B2
APPLICATION NO. : 14/975389
DATED : June 19, 2018
INVENTOR(S) : Chin-Wei Lin et al.

Page 1 of 1

It is certified that error appears in the above-identified patent and that said Letters Patent is hereby corrected as shown below:

In the Claims

Column 21, Line 60 (Claim 4) - insert --to-- between "configured" and "facilitate".

Column 22, Line 57 (Claim 11) - replace "display" with --displayed--.

Column 24, Line 31 (Claim 16) - replace "display" with --displayed--.

Column 24, Lines 53-54 (Claim 16) - delete "the first display pixel".

Column 24, Lines 65-66 (Claim 17) - delete "first amplifier to input".

Column 25, Line 54 (Claim 19) - replace "display" with --displayed--.

Column 26, Line 40 (Claim 21) - replace "comprise" with --comprises--.

Column 26, Line 56 (Claim 21) - replace "model" with --mode--.

Column 28, Line 1 (Claim 25) - replace "comprise" with --comprises--.

Signed and Sealed this
Fourth Day of December, 2018

Andrei Iancu
*Director of the United States Patent and Trademark Office*